US011062971B2

(12) United States Patent
Hung et al.

(10) Patent No.: US 11,062,971 B2
(45) Date of Patent: Jul. 13, 2021

(54) PACKAGE STRUCTURE AND METHOD AND EQUIPMENT FOR FORMING THE SAME

(71) Applicant: Taiwan Semiconductor Manufacturing Company, Ltd., Hsinchu (TW)

(72) Inventors: Wensen Hung, Zhubei (TW); Tsung-Yu Chen, Hsinchu (TW); Tsung-Shu Lin, New Taipei (TW); Chen-Hsiang Lao, New Taipei (TW); Wen-Hsin Wei, Hsinchu (TW); Hsien-Pin Hu, Zhubei (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/371,769

(22) Filed: Apr. 1, 2019

(65) Prior Publication Data
US 2020/0219786 A1 Jul. 9, 2020

Related U.S. Application Data

(60) Provisional application No. 62/789,853, filed on Jan. 8, 2019.

(51) Int. Cl.
*H01L 23/00* (2006.01)
*H01L 23/367* (2006.01)
*H01L 21/48* (2006.01)
*H01L 21/56* (2006.01)
*H01L 23/31* (2006.01)
(Continued)

(52) U.S. Cl.
CPC ........ *H01L 23/3675* (2013.01); *H01L 21/486* (2013.01); *H01L 21/4853* (2013.01); *H01L 21/4878* (2013.01); *H01L 21/4882* (2013.01); *H01L 21/563* (2013.01); *H01L 21/67092* (2013.01); *H01L 23/3185* (2013.01); *H01L 23/40* (2013.01); *H01L 23/49827* (2013.01); *H01L 23/562* (2013.01); *H01L 24/16* (2013.01);
(Continued)

(58) Field of Classification Search
CPC . H01L 23/3677; H01L 23/40; H01L 23/4006; H01L 2023/4037; H01L 2023/4043
See application file for complete search history.

(56) References Cited

U.S. PATENT DOCUMENTS 5,055,909 A * 10/1991 Culver ................. H01L 23/36
257/717
5,109,320 A * 4/1992 Bourdelaise ............ H01L 23/32
257/E23.084
(Continued)

*Primary Examiner* — Nicholas J Tobergte
(74) *Attorney, Agent, or Firm* — Slater Matsil, LLP

(57) ABSTRACT

A packaged semiconductor device and a method and apparatus for forming the same are disclosed. In an embodiment, a method includes bonding a device die to a first surface of a substrate; depositing an adhesive on the first surface of the substrate; depositing a thermal interface material on a surface of the device die opposite the substrate; placing a lid over the device die and the substrate, the lid contacting the adhesive and the thermal interface material; applying a clamping force to the lid and the substrate; and while applying the clamping force, curing the adhesive and the thermal interface material.

20 Claims, 22 Drawing Sheets

(51) Int. Cl.
*H01L 23/498* (2006.01)
*H01L 25/065* (2006.01)
*H01L 21/67* (2006.01)
*H01L 23/40* (2006.01)

(52) U.S. Cl.
CPC ............... *H01L 25/0655* (2013.01); *H01L 2224/16225* (2013.01)

(56) References Cited

U.S. PATENT DOCUMENTS

| | | | | |
|---|---|---|---|---|
| 5,745,344 A * | 4/1998 | Baska | ................ | H01L 21/4871 |
| | | | | 165/185 |
| 6,130,821 A * | 10/2000 | Gerber | ................ | H01L 23/4093 |
| | | | | 165/185 |
| 6,292,367 B1 * | 9/2001 | Sikka | ................ | H01L 23/3731 |
| | | | | 165/185 |
| 6,870,258 B1 * | 3/2005 | Too | ................ | H01L 21/50 |
| | | | | 257/704 |
| 7,193,318 B2 * | 3/2007 | Colgan | ................ | H01L 25/0655 |
| | | | | 257/713 |
| 7,256,067 B1 * | 8/2007 | Too | ................ | H01L 21/50 |
| | | | | 257/704 |
| 7,733,655 B2 * | 6/2010 | Beaumier | ................ | H01L 23/10 |
| | | | | 361/719 |
| 7,892,883 B2 * | 2/2011 | Kostiew | ................ | H01L 23/10 |
| | | | | 438/106 |
| 8,202,765 B2 * | 6/2012 | Casey | ................ | H01L 23/3675 |
| | | | | 438/122 |
| 8,981,550 B2 * | 3/2015 | Park | ................ | H01L 23/34 |
| | | | | 257/690 |
| 9,082,743 B2 * | 7/2015 | Hung | ................ | H01L 24/32 |
| 9,089,052 B2 * | 7/2015 | Li | ................ | H05K 1/0204 |
| 9,269,694 B2 * | 2/2016 | Chen | ................ | H01L 21/52 |
| 9,379,036 B2 * | 6/2016 | Hung | ................ | H01L 23/34 |
| 9,576,938 B2 * | 2/2017 | Hung | ................ | H01L 23/34 |
| 9,583,415 B2 * | 2/2017 | Yu | ................ | H01L 23/36 |
| 9,595,506 B2 * | 3/2017 | Chen | ................ | H01L 23/3672 |
| 9,941,251 B2 * | 4/2018 | Hung | ................ | H01L 24/92 |
| 10,062,665 B2 * | 8/2018 | Chen | ................ | H01L 25/50 |
| 10,269,669 B2 * | 4/2019 | Han | ................ | H01L 23/053 |
| 10,269,682 B2 * | 4/2019 | Hsieh | ................ | H01L 24/20 |
| 2004/0227240 A1 * | 11/2004 | Bolken | ................ | H01L 24/97 |
| | | | | 257/738 |
| 2004/0238947 A1 * | 12/2004 | Rumer | ................ | H01L 23/4093 |
| | | | | 257/707 |
| 2004/0261987 A1 * | 12/2004 | Zhang | ................ | H01L 23/373 |
| | | | | 165/183 |
| 2007/0119582 A1 * | 5/2007 | Zhang | ................ | H01L 24/31 |
| | | | | 165/183 |
| 2010/0000655 A1 * | 1/2010 | Ni | ................ | H01L 23/467 |
| | | | | 156/60 |
| 2010/0044856 A1 * | 2/2010 | Sri-Jayantha | ................ | H01L 23/10 |
| | | | | 257/717 |
| 2014/0091461 A1 * | 4/2014 | Shen | ................ | H01L 23/24 |
| | | | | 257/738 |
| 2014/0167243 A1 * | 6/2014 | Shen | ................ | H01L 23/4334 |
| | | | | 257/692 |
| 2015/0035134 A1 * | 2/2015 | Hung | ................ | H01L 24/32 |
| | | | | 257/712 |
| 2015/0108628 A1 * | 4/2015 | Yu | ................ | H01L 23/36 |
| | | | | 257/712 |
| 2015/0162307 A1 * | 6/2015 | Chen | ................ | H01L 21/56 |
| | | | | 257/712 |
| 2016/0093598 A1 * | 3/2016 | Jo | ................ | H01L 25/0652 |
| | | | | 257/713 |
| 2017/0186665 A1 * | 6/2017 | Choudhury | ................ | H01L 24/27 |
| 2018/0166351 A1 * | 6/2018 | Han | ................ | H01L 23/10 |

* cited by examiner

PACKAGE STRUCTURE AND METHOD AND EQUIPMENT FOR FORMING THE SAME

PRIORITY CLAIM AND CROSS-REFERENCE

This application claims the benefit of U.S. Provisional Application No. 62/789,853, filed on Jan. 8, 2019, entitled "Process and Structure for Lidded 3DIC Package," which application is hereby incorporated herein by reference.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size, which allows more components to be integrated into a given area.

As the demand for shrinking electronic devices has grown, a need for smaller and more creative packaging techniques of semiconductor dies has emerged. An example of such packaging systems is Package-on-Package (PoP) technology. In a PoP device, a top semiconductor package is stacked on top of a bottom semiconductor package to provide a high level of integration and component density. Another example is a Chip-On-Wafer-On-Substrate (CoWoS) structure, where a semiconductor chip is attached to a wafer (e.g., an interposer) to form a Chip-On-Wafer (CoW) structure. The CoW structure is then attached to a substrate (e.g., a printed circuit board) to form a CoWoS structure. These and other advanced packaging technologies enable production of semiconductor devices with enhanced functionalities and small footprints.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
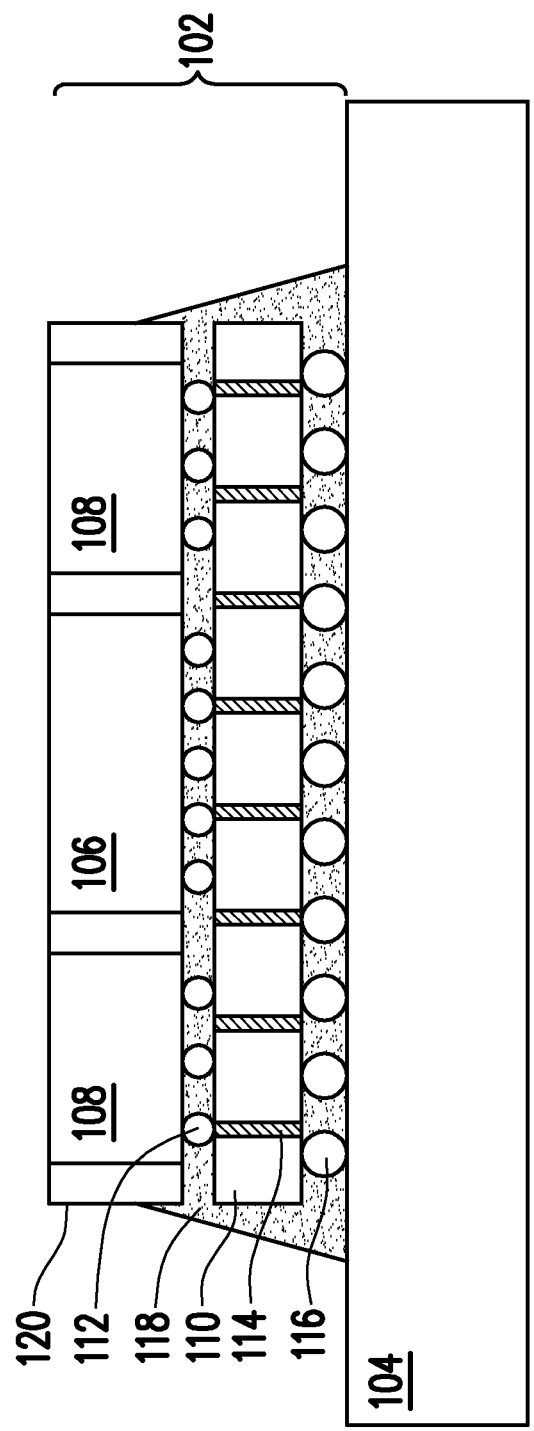
FIGS. 1-4 illustrate cross-sectional views of a clamped curing process for a 3DIC, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments provide improved methods for forming three-dimensional integrated circuit devices (e.g., Chip-on-Wafer-on-Substrate (CoWoS) devices), equipment for performing said methods, and three-dimensional integrated circuit (3DIC) devices formed by said methods. The methods include applying a clamping force to a lid and a substrate of the 3DICs during a curing process used to cure an adhesive and a thermal interface material (TIM) which thermally and mechanically attach the substrate and a Chip-on-Wafer (CoW) disposed thereon to the lid. Clamping the 3DICs during the curing process helps to reduce and control the thickness of the adhesive and the TIM, which reduces the thicknesses of the 3DICs and reduces delamination and die cracking issues in the 3DICs. This improves the thermal and mechanical stability of the 3DICs, reduces defects in the 3DICs, improves the thermal performance of the 3DICs, and results in an increased throughput of the 3DICs.

FIGS. 1 through 4 illustrate cross-sectional views of intermediate stages of manufacturing a three-dimensional integrated circuit (3DIC) package, such as a Chip-on-Wafer-on-Substrate (CoWoS) package 100 in accordance with various embodiments. In various embodiments, the CoWoS package 100 may include chip stacking such as logic-on-logic (LoL), memory-on-logic (MoL), or the like. FIG. 1 illustrates a Chip-on-Wafer (CoW) package 102 bonded to a substrate 104. The CoW package 102 may include a high-power consuming die 106 disposed between two low-power consuming dies 108. The high-power consuming die 106 and the low-power consuming dies 108 may be die stacks and may be referred to as chips. The high-power consuming die 106 consumes a relatively high amount of power and, therefore, generates a relatively large amount of heat compared to the lower-power consuming dies 108. For example, the high-power consuming die 106 may consume from about 100 W to about 1,000 W of power and the low-power consuming dies 108 may consume from about 10 W to about 100 W of power. A ratio of the power consumed by the high-power consuming die 106 to the power consumed by the low-power consuming dies 108 may be from about 10 to about 30, such as about 16. The high-power consuming die 106 may be a processor, such as a central processing unit (CPU), a graphics processing unit (GPU), or the like. The low-power consuming dies 108 may be memory dies such as high bandwidth memory (HBM), memory cubes, memory stacks, or the like. While FIG. 1 illustrates a CoW package 102 having one high-power consuming die 106 and two low-power consuming dies 108, other embodiments may include any number of high-power consuming dies 106 and/or low-power consuming dies 108.

The high-power consuming die 106 and the low-power consuming dies 108 may be surrounded by an encapsulant 120 which includes a molding compound. The high-power consuming die 106, the low-power consuming dies 108, and the encapsulant 120 may be planarized such that top surfaces of the high-power consuming die 106, the low-power consuming dies 108, and the encapsulant 120 are level. Because heat may not be generated in the encapsulant 120, heat dissipation requirements may be lower in areas near the encapsulant 120.

The high-power consuming die 106 and the low-power consuming dies 108 are bonded to a top surface of a package component 110. The high-power consuming die 106 and the low-power consuming dies 108 may be electrically and mechanically coupled to the package component 110 through a first plurality of connectors 112, which may be conductive bumps, micro bumps, metal pillars, or the like. Although not separately illustrated, one or more underfill materials (separate from underfill material 118, discussed below) may be formed between the high-power consuming die 106 and the low-power consuming dies 108 and the package component 110, surrounding the first connectors 112.

The package component 110 may be an interposer substrate, which may be a semiconductor substrate such as a silicon substrate. The package component 110 may also be formed of another semiconductor material such as silicon germanium, silicon carbon, or the like. In accordance with some embodiments, active devices such as transistors (not separately illustrated) are formed at a surface of the package component 110. Passive devices (not separately illustrated) such as resistors and/or capacitors may also be formed in the package component 110. In accordance with alternative embodiments of the present disclosure, the package component 110 may be a semiconductor substrate or a dielectric substrate, and the respective package component 110 may not include active devices therein. In accordance with these embodiments, the package component 110 may, or may not, include passive devices formed therein.

Through vias 114 may be formed to extend from the top surface of the package component 110 into the package component 110. The through vias 114 may be referred to as through-substrate vias or through-silicon vias in embodiments in which the package component 110 is a silicon substrate. In some embodiments, the package component 110 may include an interconnect structure (not separately illustrated) formed over a substrate which is used to electrically connect to the integrated circuit devices, if any, and the through vias 114 of the CoW package 102. The interconnect structure may include a plurality of dielectric layers, metal lines formed in the dielectric layers, and vias formed between, and interconnecting, the overlying and underlying metal lines. In accordance with some embodiments, the dielectric layers 30 may be formed of silicon oxide, silicon nitride, silicon carbide, silicon oxynitride, combinations thereof, and/or multi-layers thereof. Alternatively, the dielectric layers may include one or more low-k dielectric layers having low dielectric constants (k values). The k values of the low-k dielectric materials in the dielectric layers may be lower than about 3.0 or lower than about 2.5, for example.

The package component 110 of the CoW package 102 is bonded to a top surface of the substrate 104. The package component 110 may be electrically and mechanically coupled to the substrate 104 through a second plurality of connectors 116, which may be conductive bumps, micro bumps, metal pillars, or the like. An underfill material 118 may be formed between the package component 110 and the substrate 104, surrounding the second connectors 116. The underfill material 118 may also extend between the high-power consuming die 106 and the low-power consuming dies 108 and the package component 110, surrounding the first connectors 112.

The substrate 104 may be a package substrate, which may be a printed circuit board (PCB) or the like. The substrate 104 may include one or more dielectric layers and electrically conductive features, such as conductive lines and vias. In some embodiments, the substrate 104 may include through-vias, active devices, passive devices, and the like. The substrate 104 may further include conductive pads formed at the upper and lower surfaces of the substrate 104. The second connectors 116 may be coupled to conductive pads at the top surface of the substrate 104.

Figure 2:
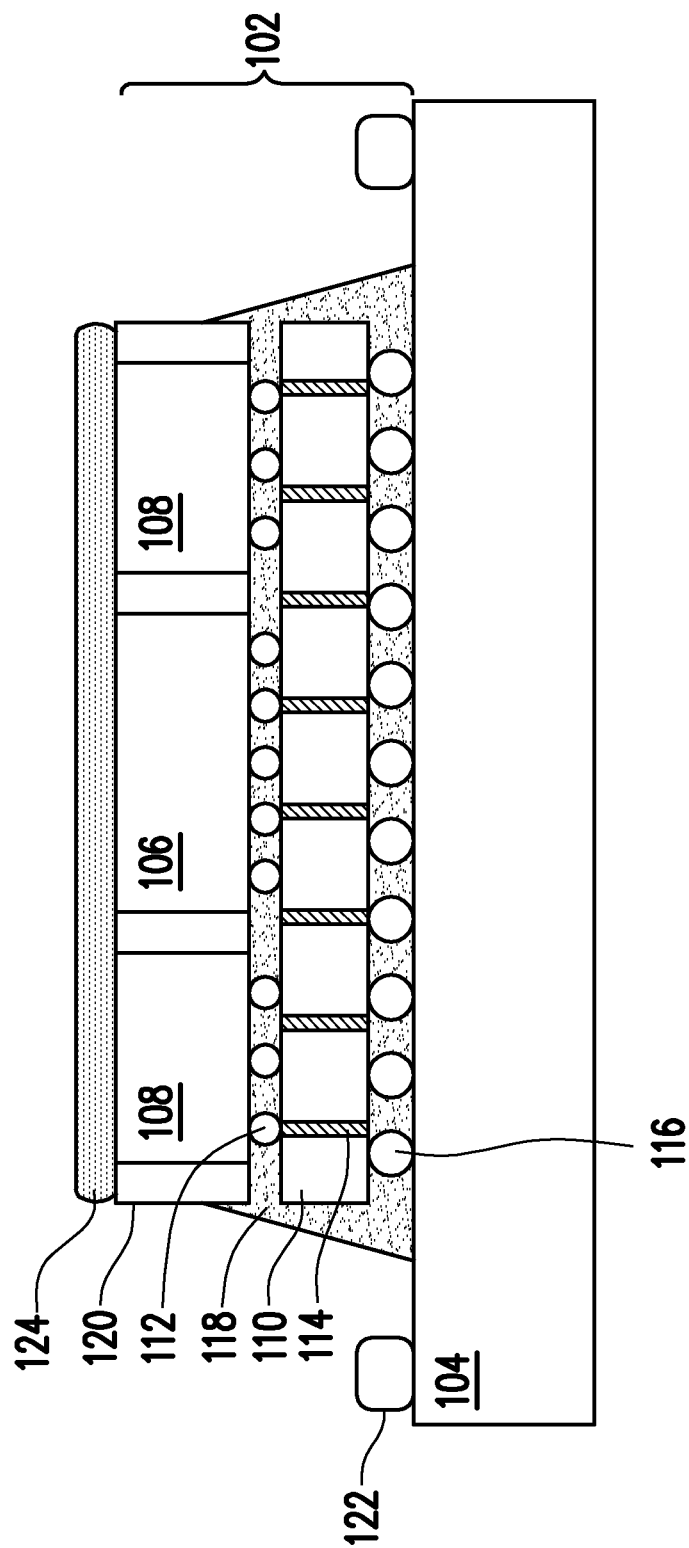

In FIG. 2, an adhesive 122 and a thermal interface material (TIM) 124 are deposited on the substrate 104 and over the encapsulant 120, the high-power consuming die 106, and the low-power consuming dies 108, respectively. The adhesive 122 may be an epoxy, a silicon resin, a glue, or the like. The adhesive 122 may have a better adhering ability than the TIM 124. The adhesive 122 may have a thermal conductivity from about 1 W/m·K to about 3 W/m·K, lower than about 0.5 W/m·K, or the like. The adhesive 122 may be positioned so as to allow a heat dissipating feature (e.g., a lid 126, illustrated in FIG. 3) to be attached around the CoW package 102. Thus, in some embodiments, the adhesive 122 may be disposed around the perimeter of, or even encircle, the CoW package 102.

The TIM 124 may be a polymer having a good thermal conductivity, which may be from about 3 W/m·K to about 5 W/m·K. In some embodiments, the TIM 124 may include a polymer with thermal conductive fillers. The thermal conductive fillers may increase the effective thermal conductivity of the TIM 124 to be from about 10 W/m·K to about 50 W/m·K or more. Applicable thermal conductive filler materials may include aluminum oxide, boron nitride, aluminum nitride, aluminum, copper, silver, indium, a combination thereof, or the like. In other embodiments, the TIM 124 may comprise other materials such as a metallic-based or solder-based material comprising silver, indium paste, or the like. In still further embodiments, the TIM 124 may comprise a film-based or sheet-based material, such as a sheet-based material including synthesized carbon nanotubes (CNTs) or a thermally conductive sheet having vertically oriented graphite fillers. Although the TIM 124 is illustrated as a continuous TIM extending over the high-power consuming die 106 and the low-power consuming dies 108, in other embodiments, the TIM 124 may be physically disconnected. For example, air gaps may be disposed in the TIM 124 between adjacent dies (e.g., the high-power consuming die 106 and/or the low-power consuming dies 108) to reduce lateral thermal interaction between the dies. In some embodiments, the TIM 124 may be deposited after the adhesive 122; however, the TIM 124 may also be deposited before the adhesive 122.

Figure 3:
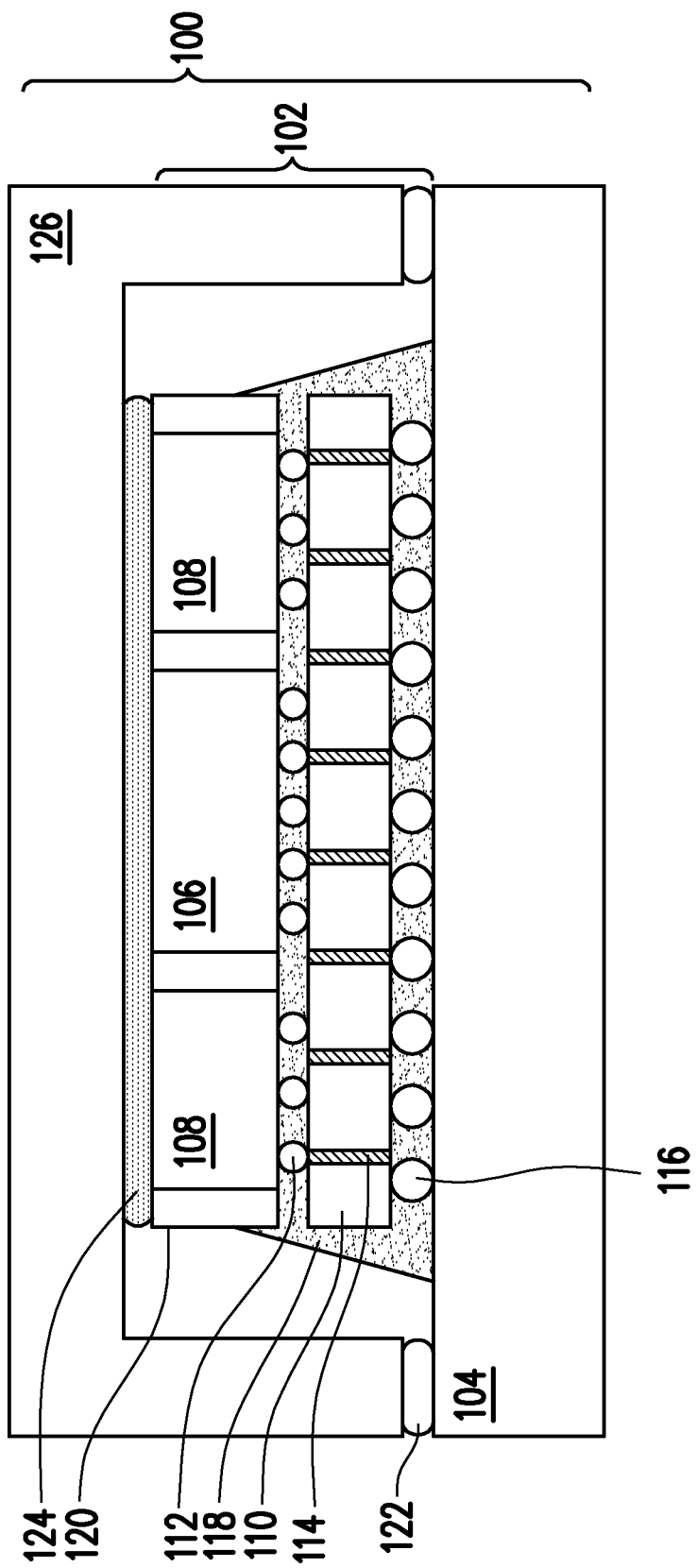

In FIG. 3, a lid 126 is attached to the substrate 104 and the CoW package 102 to form the CoWoS package 100. The lid 126 may be attached to protect the CoW package 102 and the substrate 104 and to spread heat generated from the CoW package 102 to a larger area, dissipating the heat from the CoW package 102. The lid 126 may be formed from a material having a high thermal conductivity, such as steel, stainless steel, copper, aluminum, combinations thereof, or the like. In some embodiments, the lid 126 may be a metal coated with another metal, such as gold. The lid 126 may be formed of a material having a thermal conductivity from about 100 W/m·K to about 400 W/m·K, such as about 400 W/m·K. The lid 126 covers and surrounds the CoW package 102. In some embodiments, the lid 126 is a single continuous material. In other embodiments, the lid 126 may include multiple pieces that may be the same or different materials.

The adhesive 122 has a greater adhering ability, but a lower thermal conductivity than the TIM 124. As a result, the adhesive 122 is disposed around the periphery of the CoW package 102 between the lid 126 and the substrate 104 to adhere the lid 126 to the substrate 104. The TIM 124 is disposed on the high-power consuming die 106 and the low-power consuming dies 108 between the high-power consuming die 106 and the low-power consuming dies 108 and the lid 126 to dissipate heat from the high-power consuming die 106 and the low-power consuming dies 108 to the lid 126.

Figure 4:
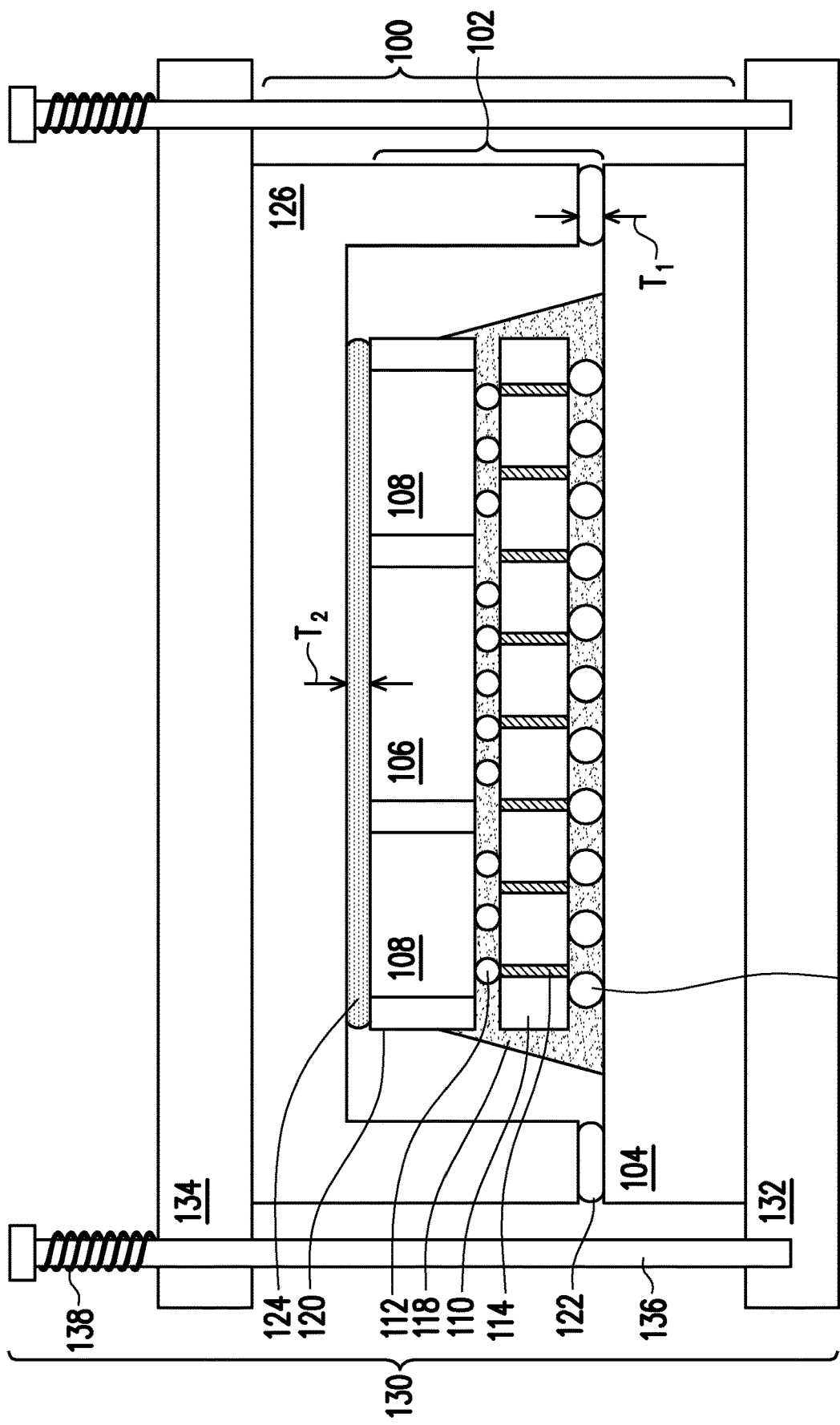

In FIG. 4, a clamp 130 is used to apply a clamping force between the lid 126 and the substrate 104. The clamp 130 includes a lower plate 132, an upper plate 134, fasteners 136, and springs 138. The clamp 130 may be used to apply a clamping force from about 3 kgf to about 100 kgf, from about 3 kgf to about 20 kgf, from about 20 kgf to about 50 kgf, or greater than about 50 kgf during a clamped curing process used to cure the adhesive 122 and/or the TIM 124. After the lid 126 and the substrate 104 are clamped, the adhesive 122 may have a thickness $T_1$ from about 100 μm to about 200 μm, from about 200 μm to about 300 μm, or less than about 100 μm and the TIM 124 may have a thickness $T_2$ from about 30 μm to about 60 μm, from about 60 μm to about 150 μm, or less than about 200 μm.

Once the lid 126 and the substrate 104 are clamped, the adhesive 122 and the TIM 124 may be cured by applying heat to the adhesive 122 and the TIM 124. In some embodiments, the adhesive 122 and the TIM 124 may be cured by placing the clamped CoWoS package 100 in a curing oven. The adhesive 122 and the TIM 124 may be cured at a temperature from about 100° C. to about 260° C., a temperature from about 100° C. to about 150° C., a temperature from about 150° C. to about 260° C., or any other suitable temperature, for a period from about 20 seconds to about 2 hours, from about 30 minutes to about 2 hours, or any other suitable time while the clamp 130 applies the clamping force.

The lower plate 132 and the upper plate 134 may be formed of a material such as aluminum, stainless steel, copper, nickel-plated copper, copper tungsten, aluminum silicon carbide, or the like. In some embodiments, the lower plate 132 may be formed of the same or a different material than the upper plate 134. The fasteners 136 may be screw-type fasteners, push-pin fasteners, magnetic fasteners, spring-lock fasteners, or any other type of fasteners. The fasteners 136 and the springs 138 may be used to control the clamping force applied between the lower plate 132 and the upper plate 134. For example, the clamping force may be altered by providing springs with different spring constants, providing different torques to screw-type fasteners, or the like. In some embodiments, distribution plates may be disposed between the lower plate 132 and the substrate 104 and/or between the upper plate 134 and the lid 126. The distribution plates may be formed of an elastic material, a rubber material, or the like and may be used to evenly distribute the force applied by the clamp across the surfaces of the substrate 104 and/or the lid 126.

Applying the clamping force using the clamp 130 throughout the clamped curing process used to cure the adhesive 122 and/or the TIM 124 reduces the bond line thickness (BLT) of the adhesive 122 and the TIM 124, improves the uniformity of the thicknesses of the adhesive 122 and the TIM 124, and improves the coverage of the TIM 124. These improvements reduce the likelihood that the lid 126 will delaminate from the CoW package 102 and the substrate 104. As a result, semiconductor packages formed according to the above-described methods have reduced thicknesses, improved thermal performance, improved reliability, and reduced defects.

Figure 5A:
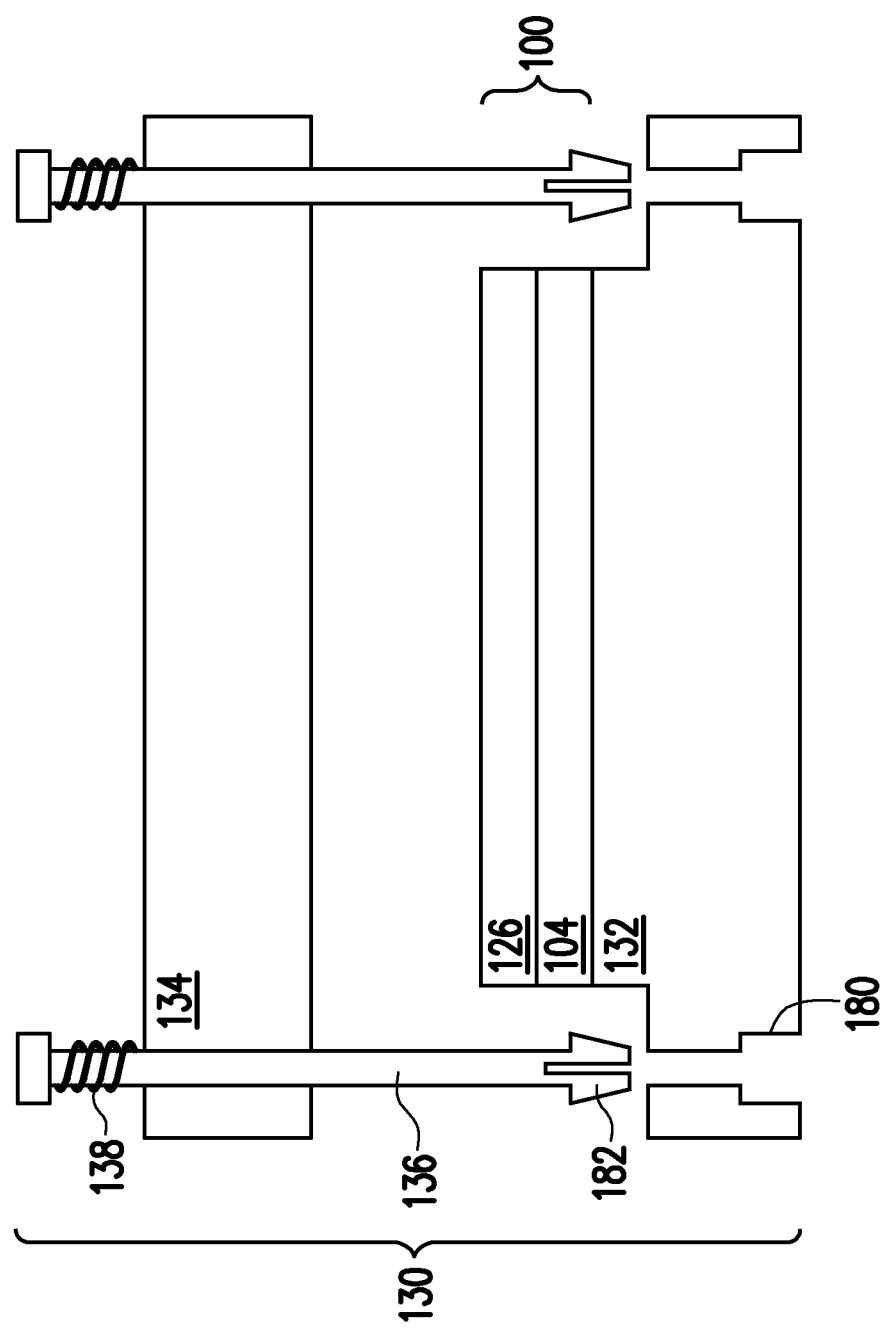
FIGS. 5A and 5B illustrate cross-sectional views of a clamp including push-pin fasteners, in accordance with some embodiments.
Figure 5B:
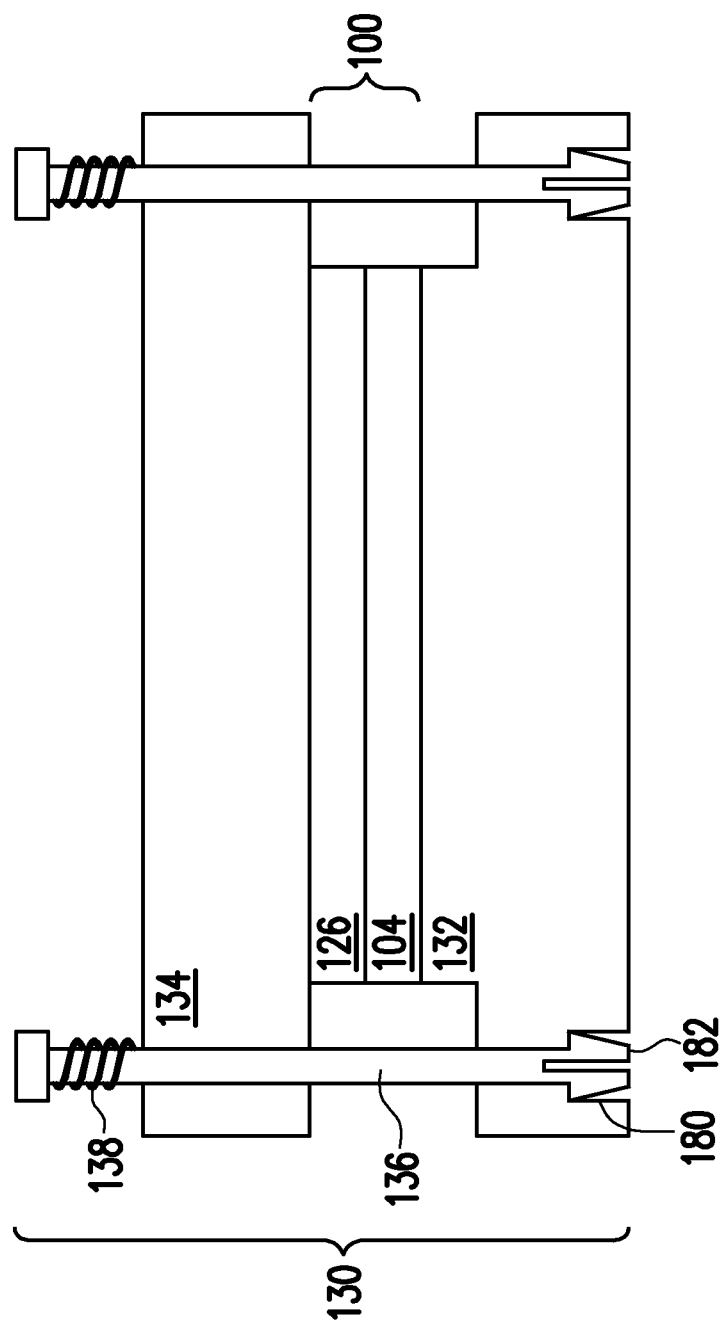

FIGS. 5A and 5B illustrate cross-sectional views of a clamp 130 in accordance with an embodiment in which the fasteners 136 comprise push-pin fasteners. As illustrated in FIG. 5A, the lower plate 132 includes push-pin holes 180 which have a first width adjacent a top surface of the lower plate 132 and a second width greater than the first width adjacent a bottom surface of the lower plate 132. The push-pin holes 180 may extend completely through the lower plate 132 such that the fasteners 136 may be removed. In embodiments in which the fasteners 136 comprise push-pin fasteners, the fasteners 136 include push-pin heads 182 which have a trapezoidal shape and are hollow. The shape of the push-pin heads 182 allows the push-pin heads 182 to deform when pressed into the push-pin holes 180 and fasten once the push-pin heads 182 are pushed into the portion of the lower plate 132 having the second width, as illustrated in FIG. 5B. The fasteners 136 can then be removed from the lower plate 132 by pushing opposite sides of the push-pin heads 182 together and pushing the push-pin heads 182 back through the push-pin holes 180. A pressing plate (not separately illustrated), may press on the fasteners of several clamps 130 simultaneously to clamp several CoWoS packages 100 simultaneously.

Figure 6:
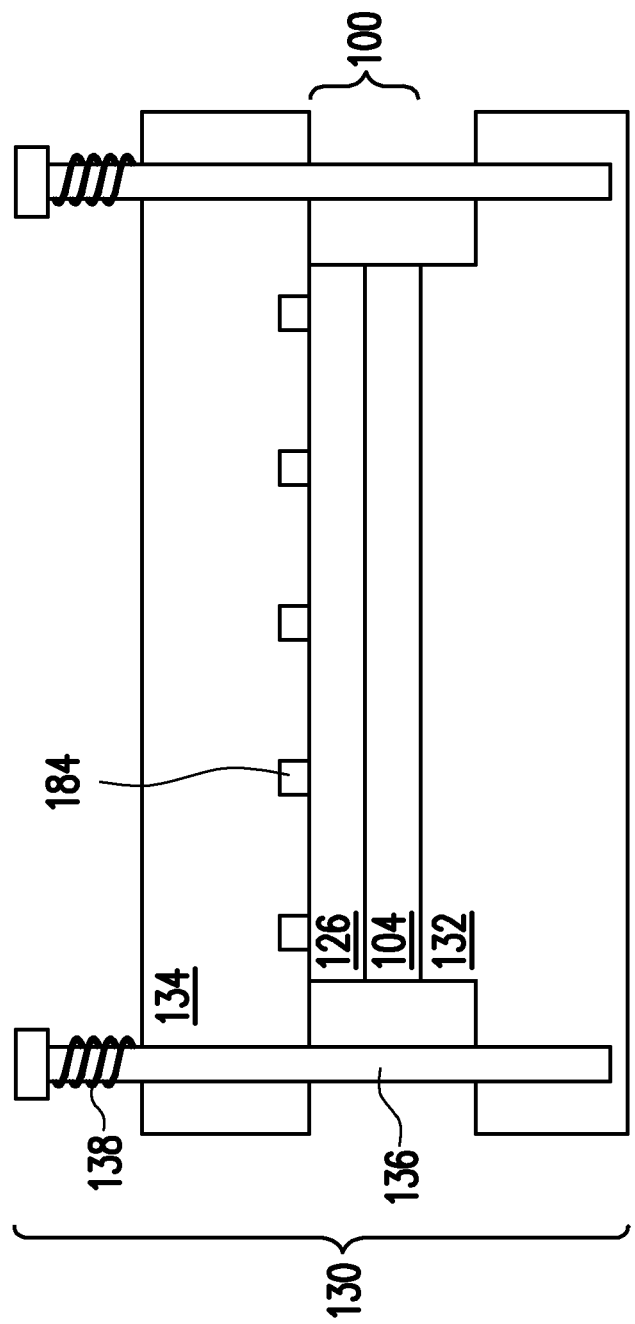
FIG. 6 illustrates a cross-sectional view of a clamp including load cells, in accordance with some embodiments.

FIG. 6 illustrates a cross-sectional view of a clamp 130 in accordance with an embodiment in which the upper plate 134 includes one or more load cells 184. In the embodiment illustrated in FIG. 6, the load cells 184 are disposed in the upper plate 134 and detect the force between the upper plate 134 and the lid 126; however, in other embodiments, the load cells 184 may be disposed in the lower plate 132 and may detect the force between the lower plate 132 and the substrate 104. In still further embodiments, the load cells 184 may be included in both the upper plate 134 and the lower plate 132. The load cells 184 may be used to determine whether the force applied to the CoWoS package 100 is within a desire range, such as from about 2 kgf to about 20 kgf or from about 20 kgf to about 100 kgf. The load cells 184 may be used in conjunction with screw-type fasteners 136. If the force detected by the load cells 184 is too low, the screw-type fasteners 136 may be torqued to apply additional force to the CoWoS package 100 and, if the force detected by the load cells 184 is too high, the screw-type fasteners 136 may be torqued to apply less force to the CoWoS package 100. Moreover, the screw-type fasteners 136 may be torqued using a torque driver having a digital output such that the screw-type fasteners 136 may be torqued to a consistent torque. The load cells 184 may detect forces from about 5 kgf to about 100 kgf, or from about 100 kgf to about 200 kgf. Any number of load cells 184 may be disposed in the upper plate 134 and/or the lower plate 132. The load cells 184 may be disposed adjacent the fasteners 136 to determine whether individual fasteners need to be torqued to apply more or less force to the CoWoS package 100.

Figure 7A:
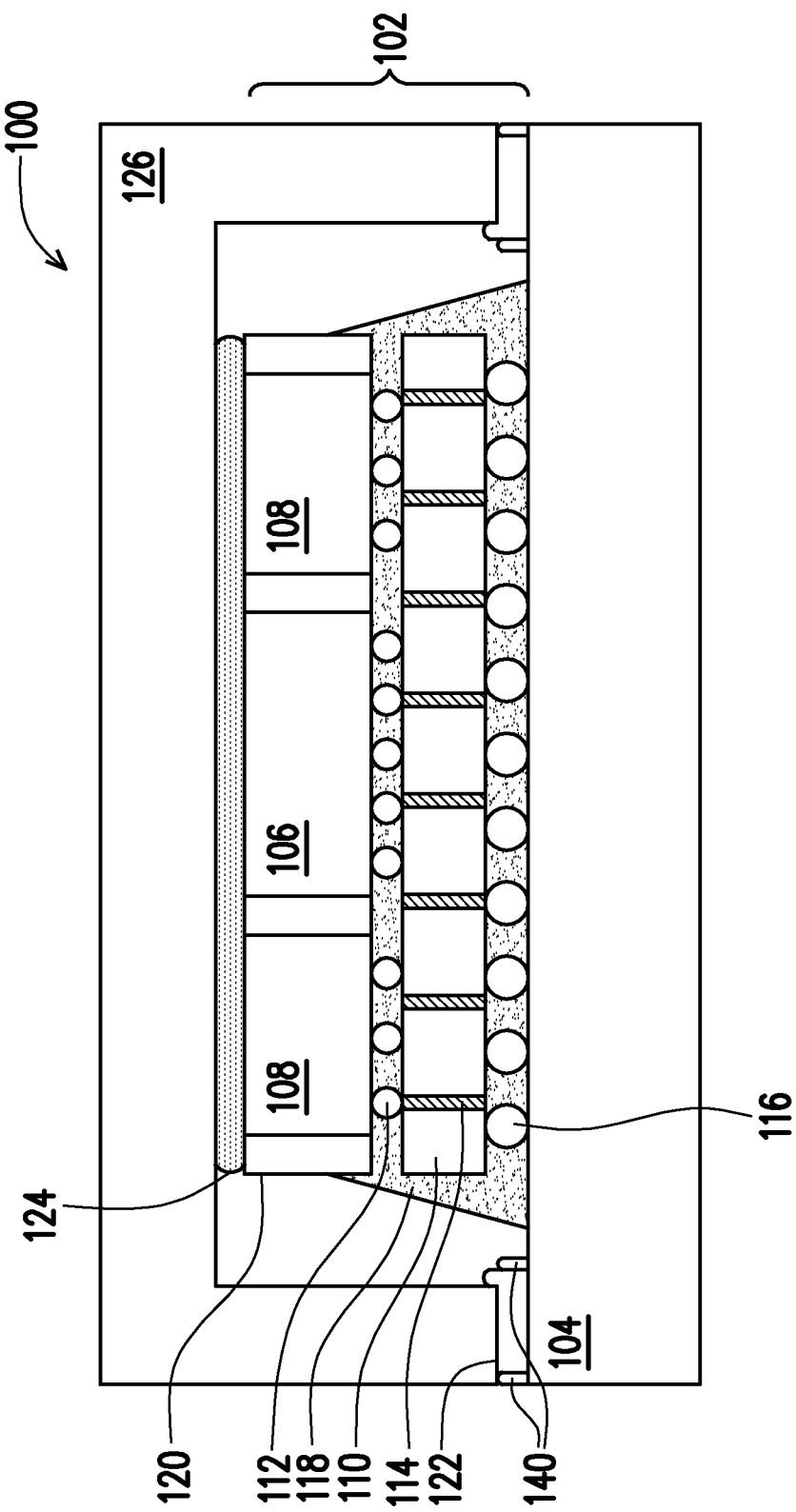
FIGS. 7A and 7B illustrate a cross-sectional view and a top-down view, respectively, of a 3DIC including a seal ring, in accordance with some embodiments.
Figure 7B:
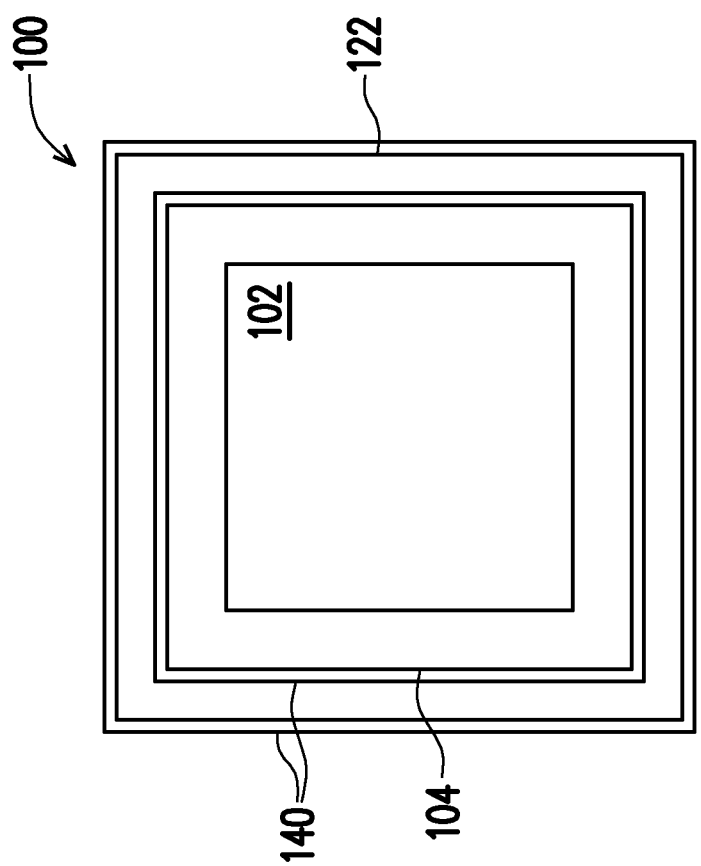

FIGS. 7A-9B illustrate various features that may be included in the CoWoS package 100 in order to prevent defects and improve reliability. The various features may be used in the CoWoS package 100 in conjunction with the clamped curing processes discussed in relation to FIGS. 4-6. FIGS. 7A and 7B illustrate a cross-sectional view and a top-down view, respectively, of an embodiment of the CoWoS package 100 in which a seal ring 140 is attached to the substrate 104 and the adhesive 122 is placed within the seal ring 140. As illustrated in FIGS. 7A and 7B, the seal ring 140 may include an outer portion encircling an outer diameter of the adhesive 122 and an inner portion disposed between the adhesive 122 and the CoW package 102 and surrounding an inner diameter of the adhesive 122. The outer portion of the seal ring 140 prevents the adhesive from overflowing the edge of the lid 126, which can cause cosmetic and other defects. The inner portion of the seal ring 140 may be disposed laterally inside an inside edge of the lid 126, as illustrated in FIG. 7A. The positioning of the inner portion of the seal ring 140 may allow the adhesive to spread up a vertical portion of the inside edge of the lid 126 when the lid 126 is clamped, which may increase the adhesion between the lid 126 and the substrate 104. In some embodiments, only the outer portion of the seal ring 140 may be included. The seal ring 140 may be formed of an elastic material, a rubber material, or the like. The seal ring 140 may have a height from about 50 μm to about 400 μm, such as about 100 μm and a thickness from about 50 μm to about 200 μm, such as about 100 μm.

Figure 8:
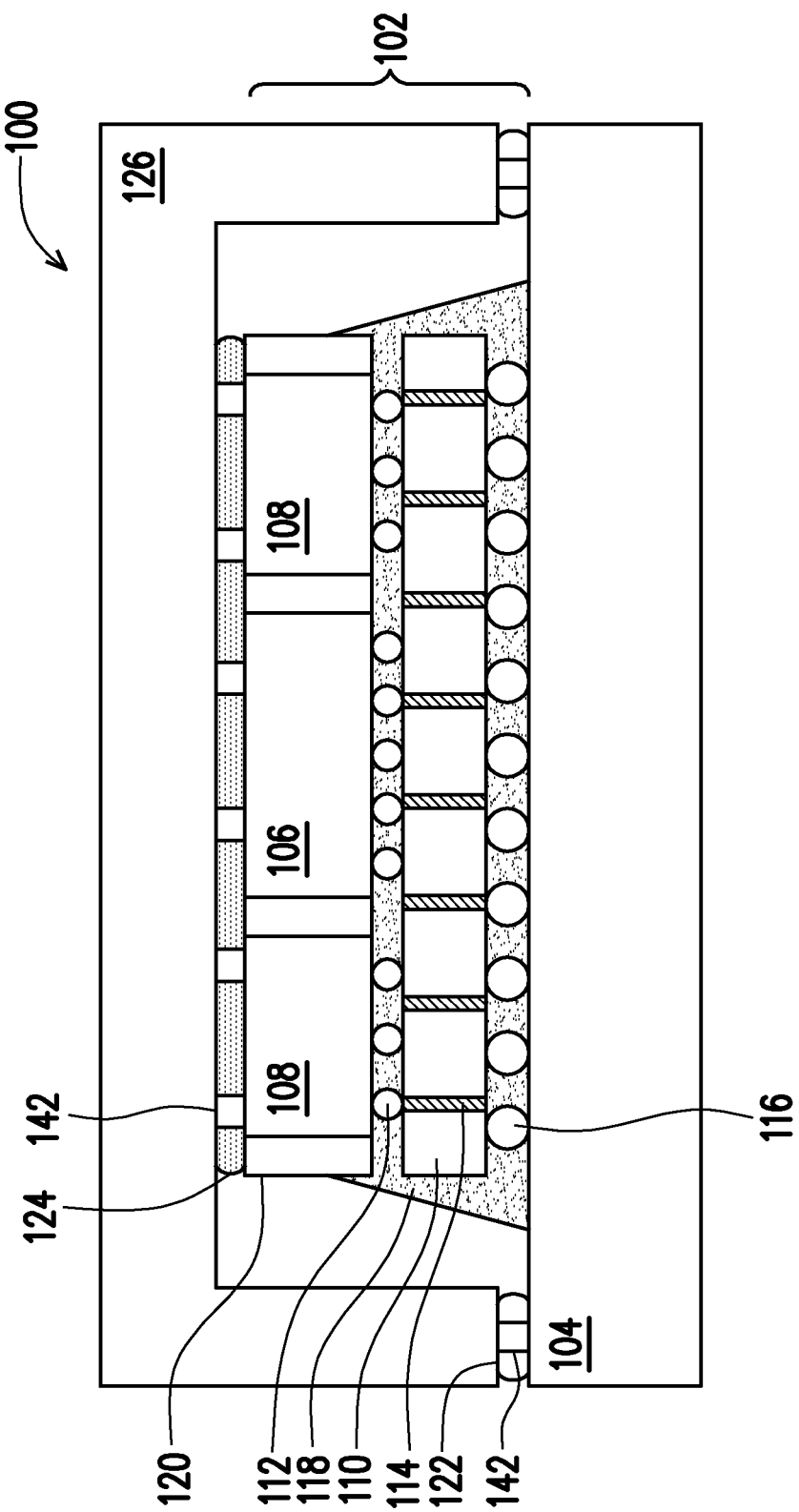
FIG. 8 illustrates a cross-sectional view of a 3DIC including spacers, in accordance with some embodiments.

FIG. 8 illustrates an embodiment of the CoWoS package 100 in which spacers 142 are disposed between the lid 126 and the substrate 104. The spacers 142 may be attached to the substrate 104, the lid 126, and/or the CoW package 102 prior to clamping the lid 126 to the substrate 104. In some embodiments, the spacers 142 may be included in the adhesive 122 and/or the TIM 124. The spacers 142 may be shaped as cubes, spheres, or any other suitable shape. The spacers 142 may have a length/diameter from about 0.5 mm to about 2 mm, such as about 1 mm. The spacers 142 may be formed of an elastic material, a rubber material, a solder material such as a solder ball, a solder joint, or a solder bar, or a film or sheet-type material such as a perforated copper sheet, a perforated graphite sheet, or the like.

The spacers 142 may be used to control the bond line thickness of the adhesive 122 and the TIM 124. Forming the adhesive 122 and/or the TIM 124 to be too thin can cause defects such as cracking, delamination, or the like of the adhesive 122 and the TIM 124. The spacers 142 prevent the adhesive 122 and the TIM 124 from becoming too thin during the clamped curing process and thus prevent defects and improve the reliability of CoWoS packages 100 including the spacers 142.

Figure 9A:
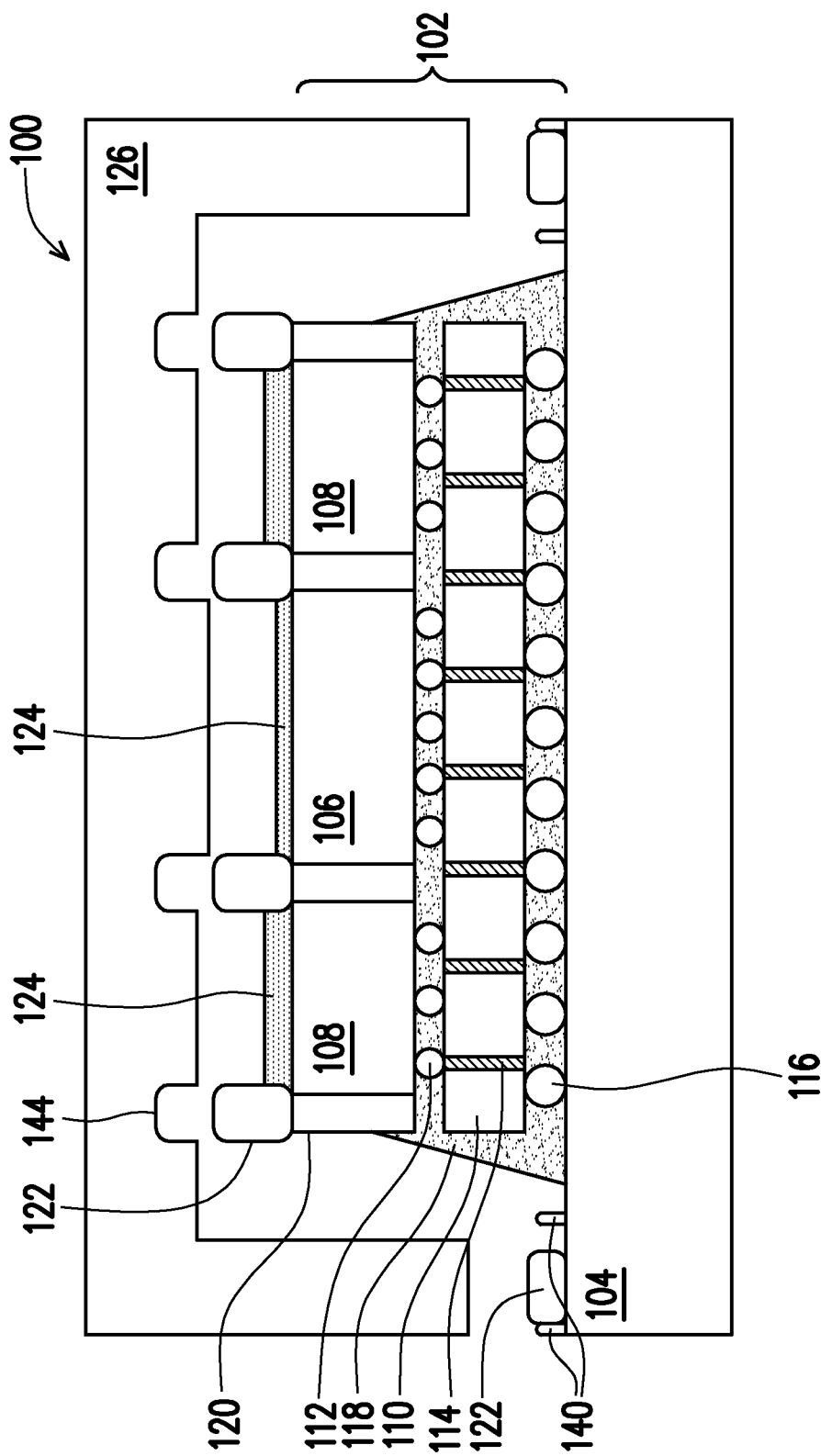
FIGS. 9A and 9B illustrate cross-sectional views of a 3DIC including relief features, in accordance with some embodiments.
Figure 9B:
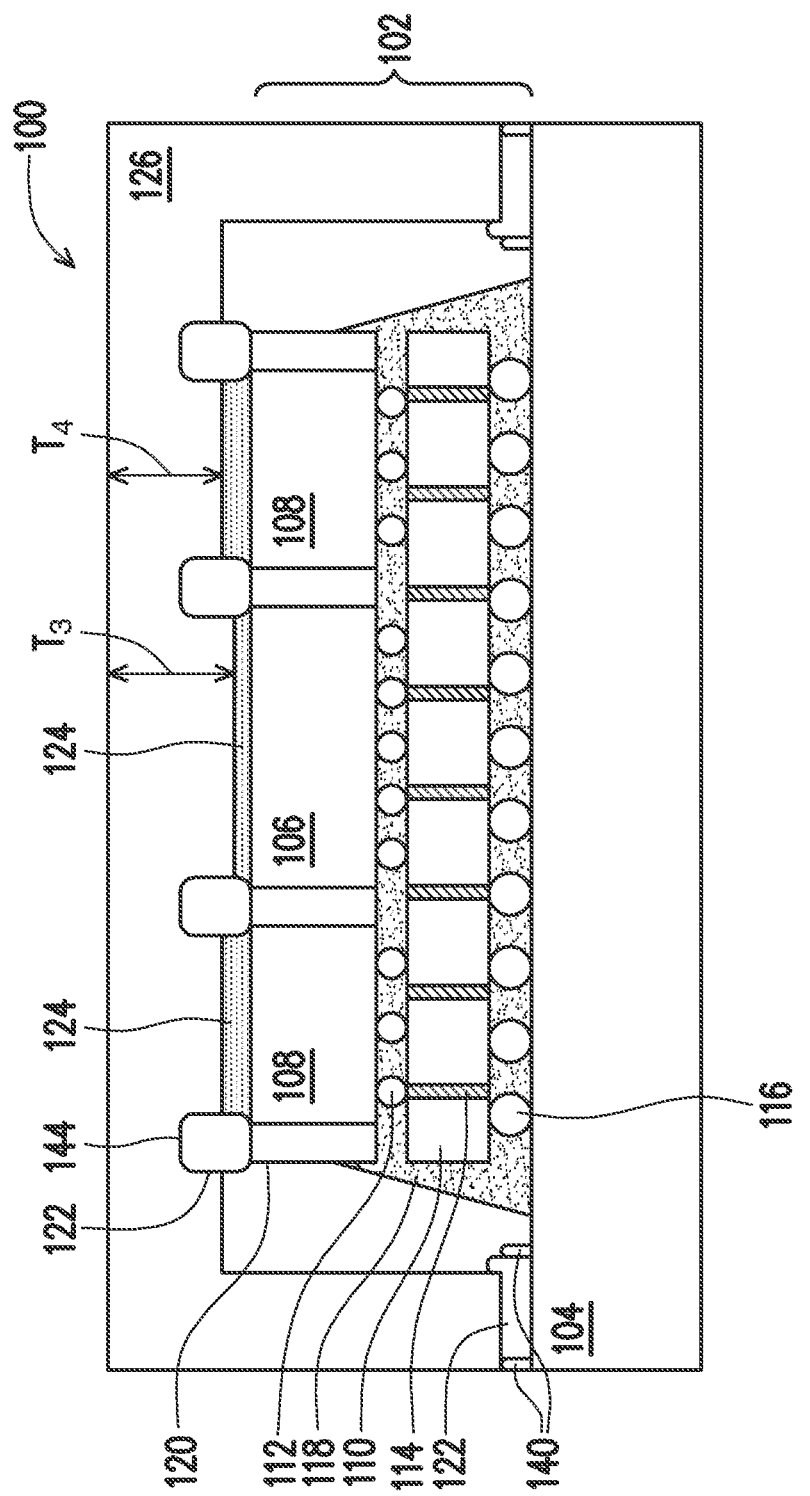

FIGS. 9A and 9B illustrate an embodiment of the CoWoS package 100 in which relief features 144 are included in the lid 126. As illustrated in FIG. 9A, the relief features 144 may be grooves, trenches, or the like formed in the lid 126. The relief features 144 may be shaped as bars, concentric squares, concentric circles, or have any other shape in a top-down view. Due to CTE mismatches between the lid 126, the substrate 104, and the CoW package 102, there may be warping of the lid 126, the substrate 104, and the CoW package 102 both during the clamped curing process and throughout the life of the CoWoS package 100. The relief features 144 may be provided to allow the lid 126 to deform and conform to any warping of the CoW package 102 and/or the substrate 104 caused by temperature changes or the like. As such, defects caused by warping can be prevented and the reliability of CoWoS packages 100 improved by including the relief features 144. As further illustrated in FIGS. 9A and 9B, the CoWoS package 100 may include both the relief features 144 and the seal ring 140. In further embodiments, the CoWoS package 100 may include any combination of the seal ring 140, the spacers 142, and the relief features 144.

The relief features 144 may further provide increased contact area between the lid 126 and the TIM 124 and/or the adhesive 122. As illustrated in FIG. 9B, the relief features 144 may be provided above areas of the CoW package 102 having reduced heat dissipation requirements (such as above the encapsulant 120) and the adhesive 122 may be applied to areas of the CoW package 102 corresponding to the relief features 144. This may improve the adhesion between the lid 126 and the CoW package 102, without negatively impacting the heat dissipation from the CoW package 102. In further embodiments (not separately illustrated), the relief features 144 may be disposed above areas of the CoW package 102 having higher heat dissipation requirements (such as above the high-power consuming die 106 and/or above the low-power consuming dies 108) and the TIM 124 may be applied to the portions of the CoW package 102 corresponding to the relief features 144, increasing the heat dissipation from the CoW package 102 to the lid 126. Accordingly, the relief features 144 may increase the adhesion of the lid 126 to the CoW package 102 and may improve heat dissipation from the CoW package 102, thereby preventing defects and improving the reliability of CoWoS packages 100 including the relief features 144.

FIG. 9B further illustrates that the lid 126 may have different thicknesses in different areas. For example, a portion of the lid 126 disposed over the high-power consuming die 106 may have a thickness $T_3$ greater than a thickness $T_4$ of a portion of the lid 126 disposed over the low-power consuming dies 108. The thickness $T_3$ may be from about 0.5 mm to about 3 mm, such as about 1 mm, while the thickness $T_4$; may be from about 0.5 mm to about 3 mm, such as about 0.5 mm. A ratio of the thickness $T_3$ to the thickness $T_4$; may be from about 2 to about 6, such as about 2. Providing a lid 126 having different thicknesses in different area may help to improve the conformability of the lid 126 with the substrate 104 and the CoW package 102, further preventing defects and improving the reliability of CoWoS packages 100 including the lid 126.

FIGS. 10A-16 illustrate various patterns for providing the adhesive 122 and the TIM 124 over the CoW package 102. The various patterns may be used to improve the adhesion and heat dissipation between the lid 126 and the CoW package 102. The various patterning schemes illustrated in FIGS. 10A-16 may be used in conjunction with the features illustrated in FIGS. 7A-9B and the clamped curing process discussed in relation to FIG. 4.

Figure 10A:
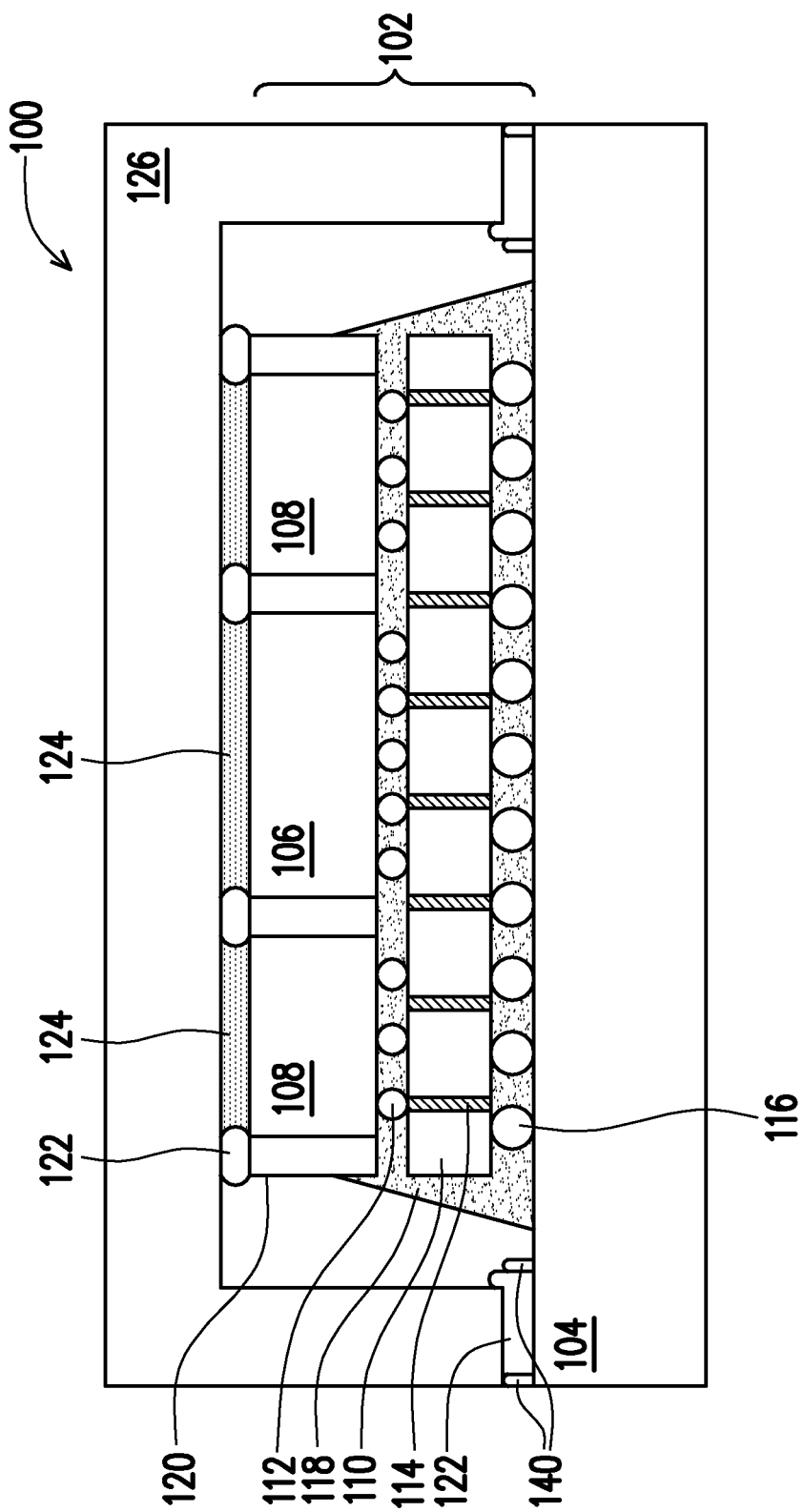
FIGS. 10A-16 illustrate various views of alternative configurations for an adhesive and a thermal interface material included in a 3DIC, in accordance with some embodiments.
Figure 10B:
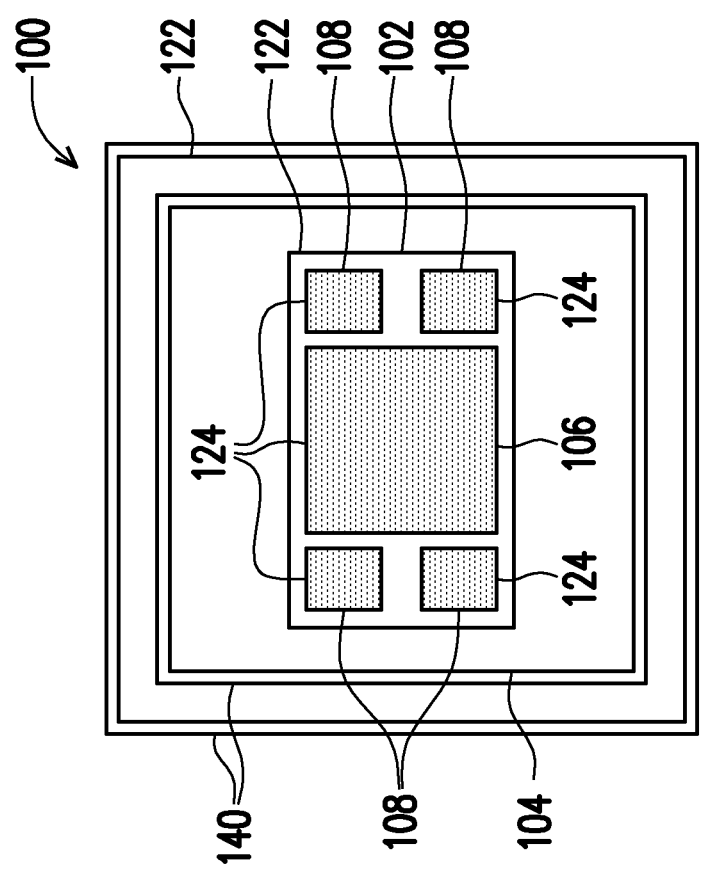

FIGS. 10A and 10B illustrate a cross-sectional view and a top-down view, respectively, of an embodiment in which the adhesive 122 is applied over portions of the CoW package 102 in which the encapsulant 120 is disposed and the TIM 124 is applied over portions of the CoW package 102 in which the high-power consuming die 106 and the low-power consuming dies 108 are disposed. As discussed previously, the high-power consuming die 106 and the low-power consuming dies 108 may generate heat, while the encapsulant 120 may not generate heat. As such, heat generation requirements are greater near the high-power consuming die 106 and the low-power consuming dies 108 and lower near the encapsulant 120. Providing the adhesive 122 over the encapsulant 120 and providing the TIM 124 over the high-power consuming die 106 and the low-power consuming dies 108 increases the adhesion between the lid 126 and the CoW package 102, while providing heat dissipation for the high-power consuming die 106 and the low-power consuming dies 108.

Figure 11:
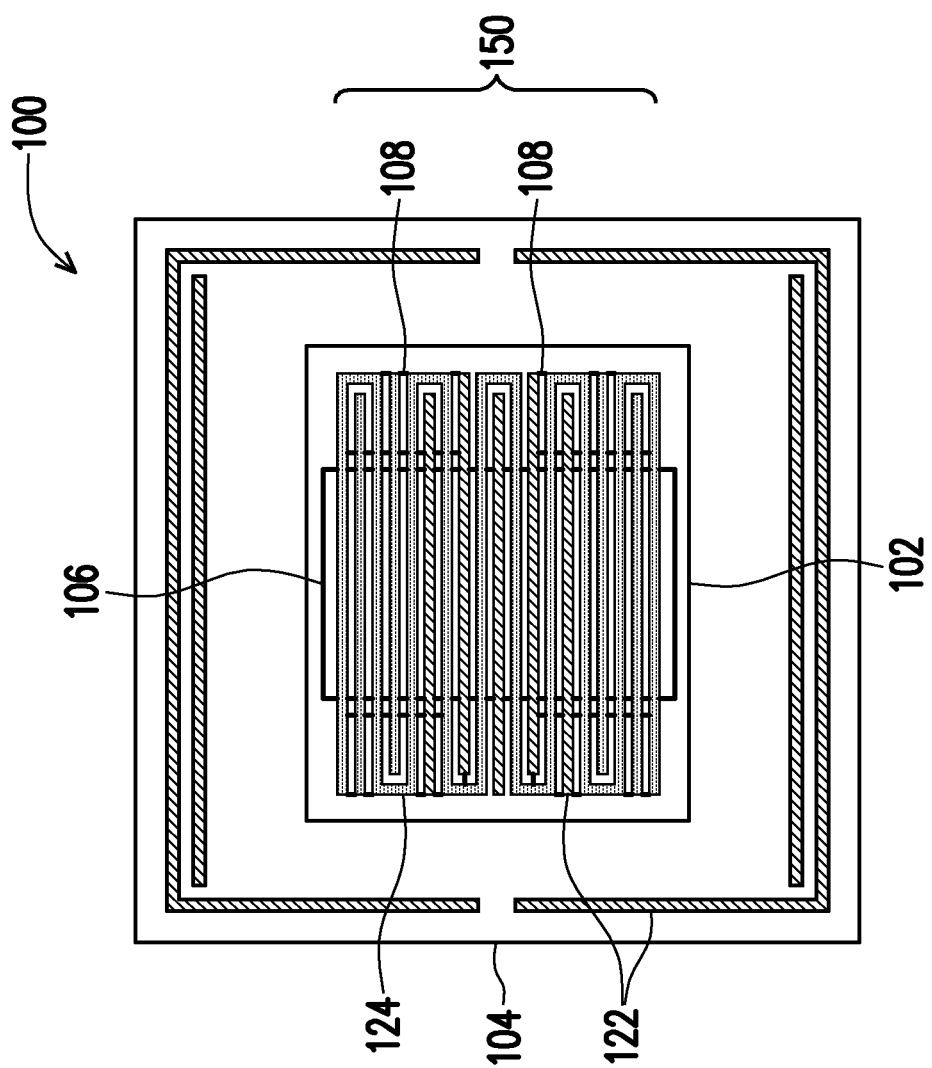
Figure 12:
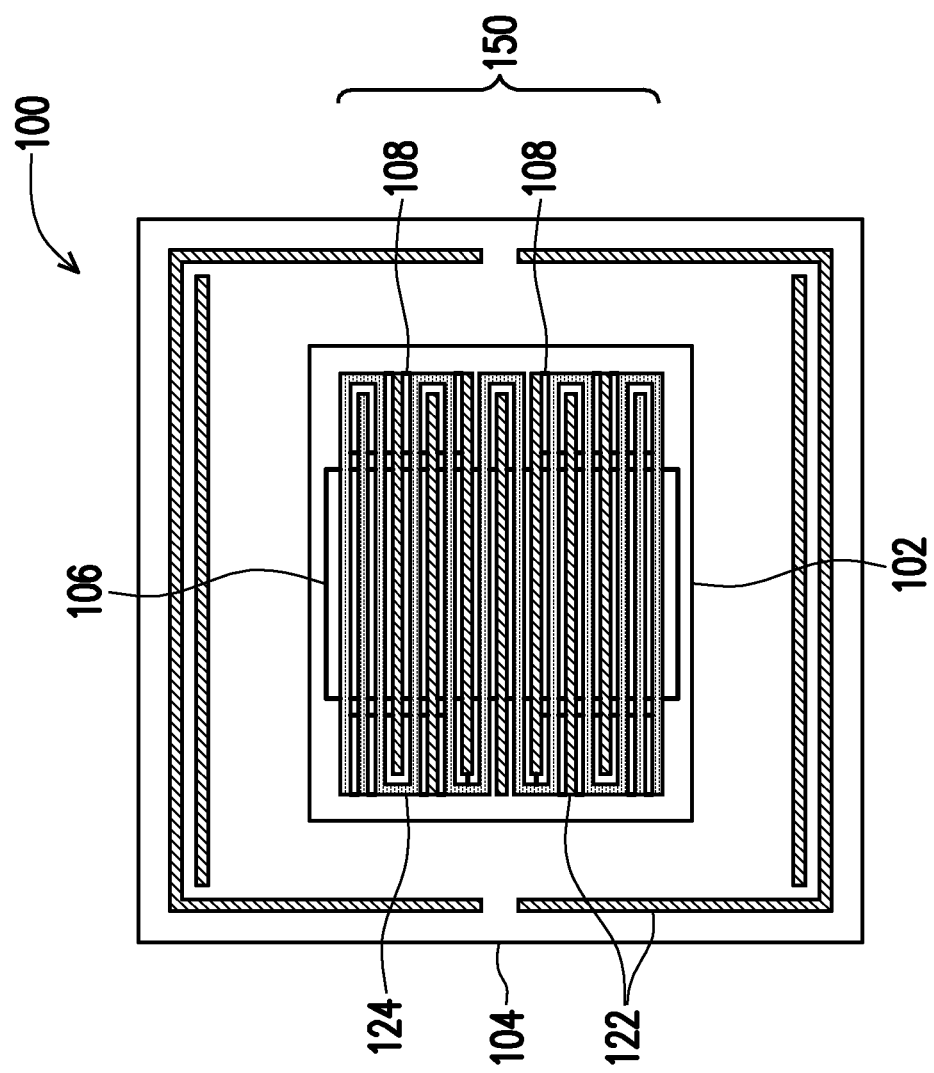
Figure 13:
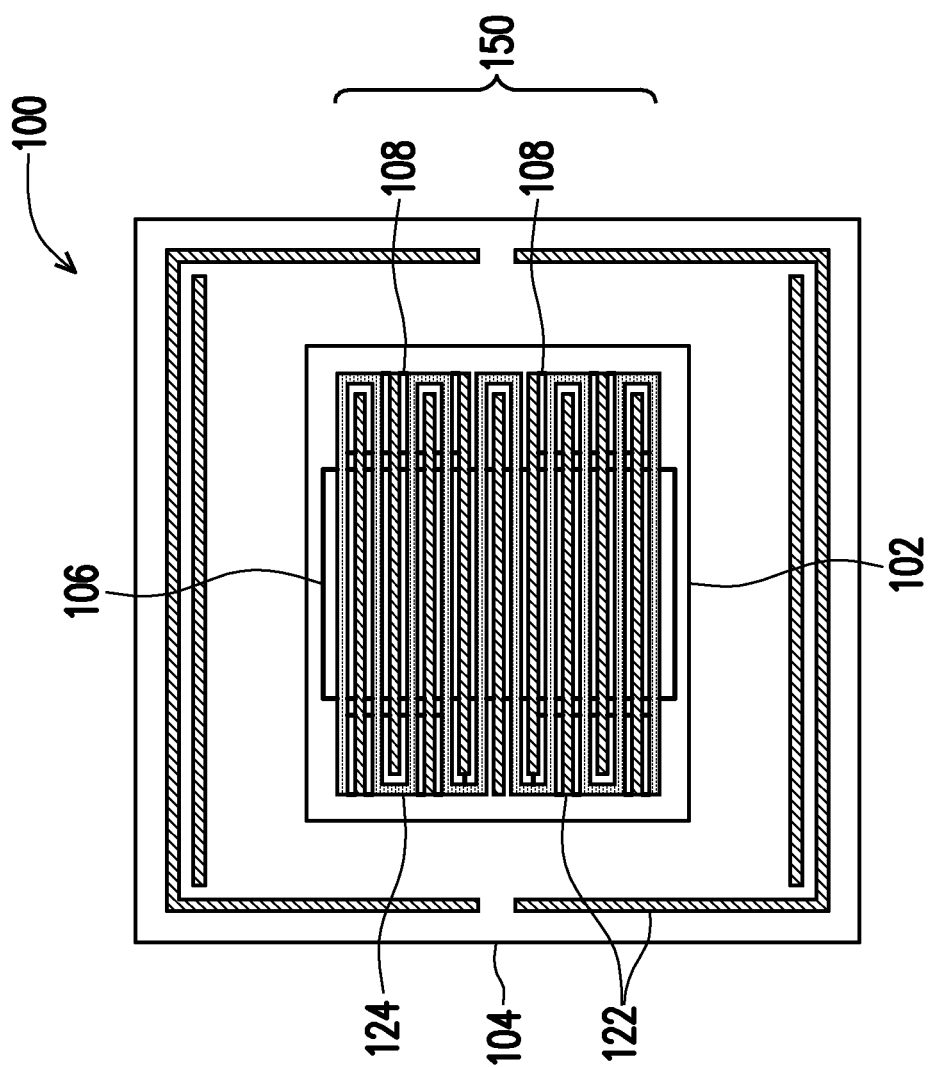

FIGS. 11-13 illustrate embodiments in which the adhesive 122 and the TIM 124, collectively referred to as lid attach material 150, are dispensed over the CoW package 102 in a snaking pattern extending from adjacent one edge of the CoW package 102 to adjacent an opposite edge of the CoW package 102. The lid attach material 150 may be dispensed in any number of rows, such as from 10 to 30 rows, or 19 rows. Odd rows of the lid attach material 150 may be interconnected, with even rows of the lid attach material 150 being disconnected. As illustrated in FIGS. 11-13, any number of the even rows, such as 5 middle even rows (FIG. 11), 7 middle even rows (FIG. 12), or 9 middle even rows (FIG. 13), may comprise the adhesive 122, while the remainder of the lid attach material comprises the TIM 124. The adhesive 122 may also be dispensed around the perimeter of the substrate 104. These embodiments may be used to improve the adhesion between the lid 126 and the CoW package 102, while providing heat dissipation for the high-power consuming die 106 and the low-power consuming dies 108.

Figure 14:
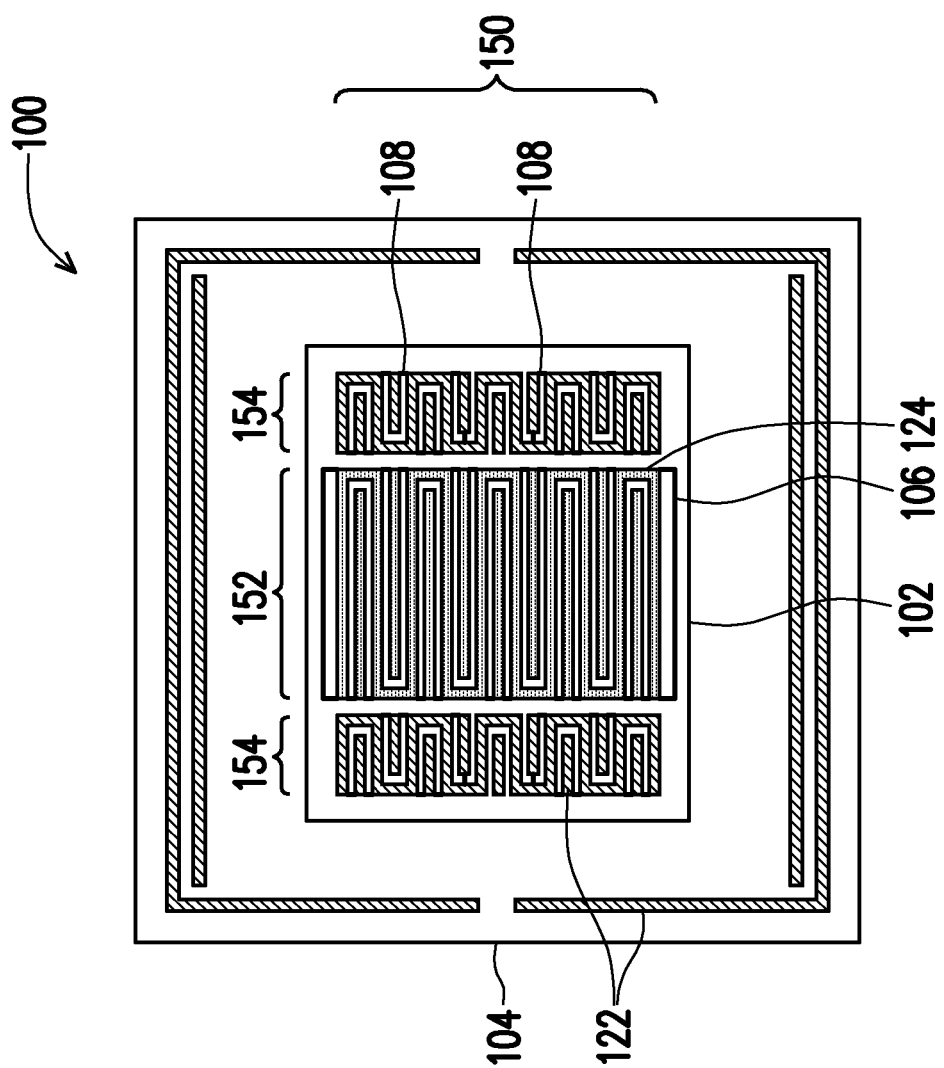
Figure 15:
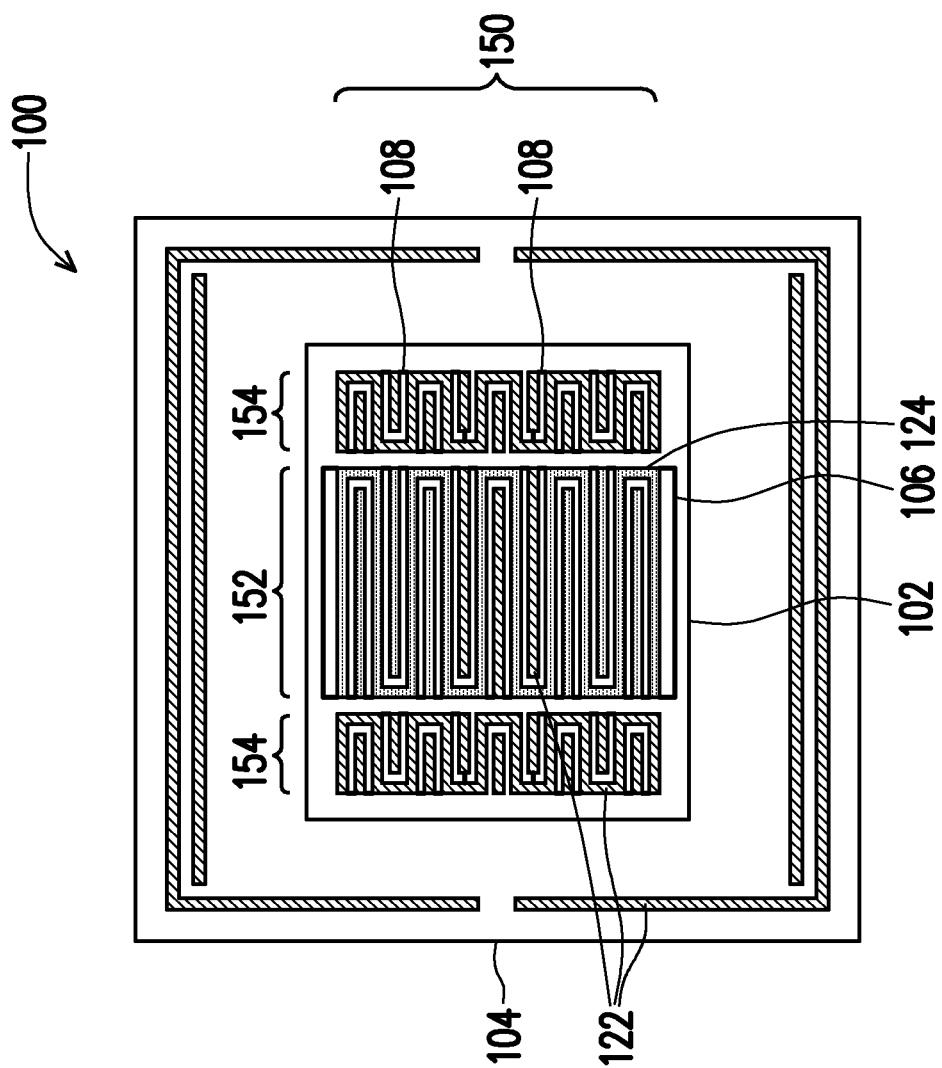
Figure 16:
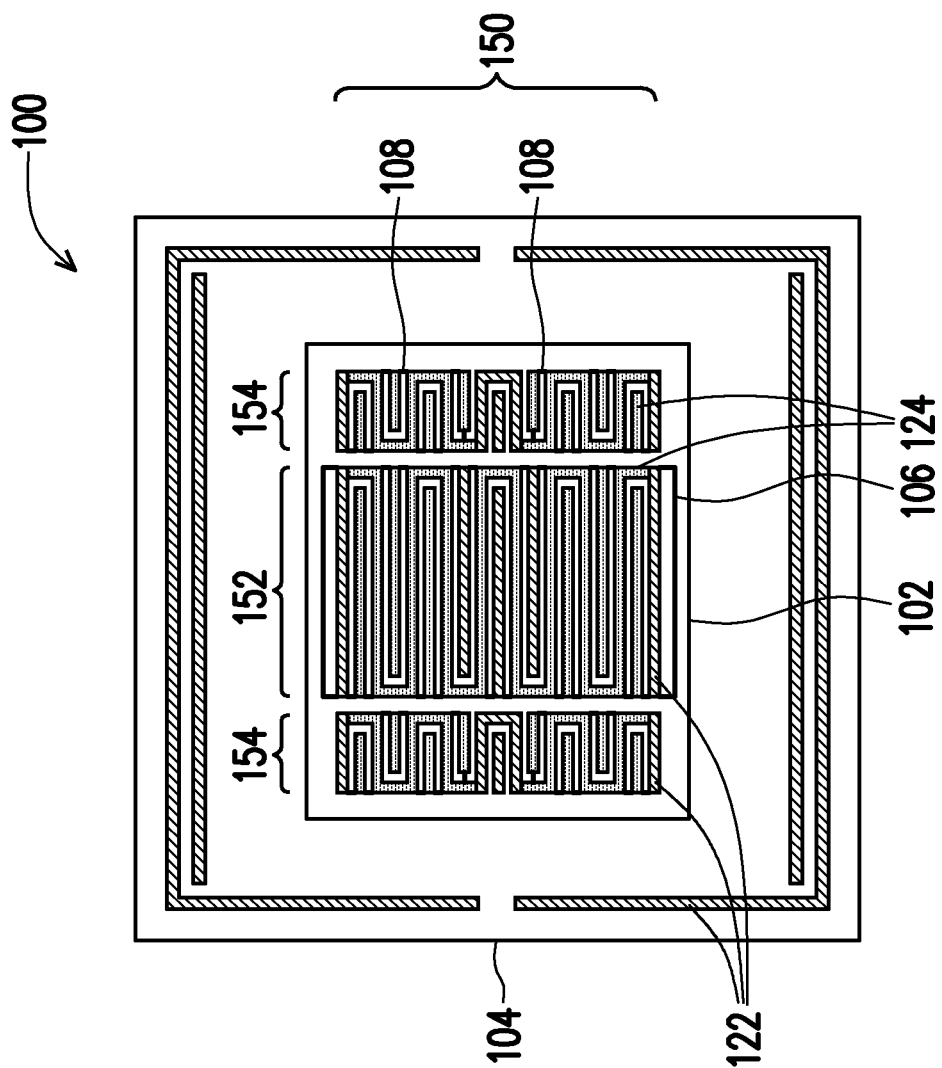

FIGS. 14-16 illustrate embodiments in which the adhesive 122 and the TIM 124, collectively referred to as the lid attach material 150, are dispensed over the CoW package 102 in several snaking patterns. The lid attach material 150 may be dispensed over the CoW package 102 in a first snaking pattern 152 extending from an edge of the high-power consuming die 106 to an opposite edge of the high-power consuming die 106 and second snaking patterns 154 extending from edges of the low-power consuming dies 108 to opposite edges of the low-power consuming dies 108. The lid attach material 150 may be dispensed in any number of rows, such as from 10 to 30 rows, or 19 rows. Odd rows of the lid attach material 150 may be interconnected, with even rows of the lid attach material 150 being disconnected. As illustrated in FIG. 14, the second snaking patterns 154 may comprise the adhesive 122, while the first snaking pattern 152 comprises the TIM 124. Thus, the adhesive 122 may be dispensed over the low-power consuming dies 108 and the encapsulant 120 and the TIM 124 may be dispensed over the high-power consuming die 106. In FIG. 15, the second snaking patterns 154 may comprise the adhesive 122, and the first snaking pattern 152 may comprise the TIM 124, with a number of even rows in the first snaking pattern 152, such as 3 even rows, comprising the adhesive 122. Thus, the adhesive 122 may be dispensed over the low-power consuming dies 108, the encapsulant 120, and a middle portion of the high-power consuming die 106 and the TIM 124 may be dispensed over the high-power consuming die 106. In FIG. 16, the first snaking pattern 152 and the second snaking patterns 154 may comprise the TIM 124, with middle and outside rows of the first snaking pattern 152 and the second snaking patterns 154 comprising the adhesive 122. Thus, the adhesive 122 may be dispensed over the encapsulant 120 and middle and edge portions of the high-power consuming die 106 and the TIM 124 may be dispensed over the high-power consuming die 106 and the low-power consuming dies 108. The adhesive 122 may also be dispensed around the perimeter of the substrate 104. Any other suitable pattern may be used to dispense the adhesive 122 and the TIM 124 over the CoW package 102 in order to provide adhesion between the CoW package 102 and the substrate 104 and the lid 126, while meeting the heat dissipation requirements of the high-power consuming die 106 and the low-power consuming dies 108. These embodiments may be used to improve the adhesion between the lid 126 and the CoW package 102, while providing heat dissipation for the high-power consuming die 106 and the low-power consuming dies 108.

Figure 17A:
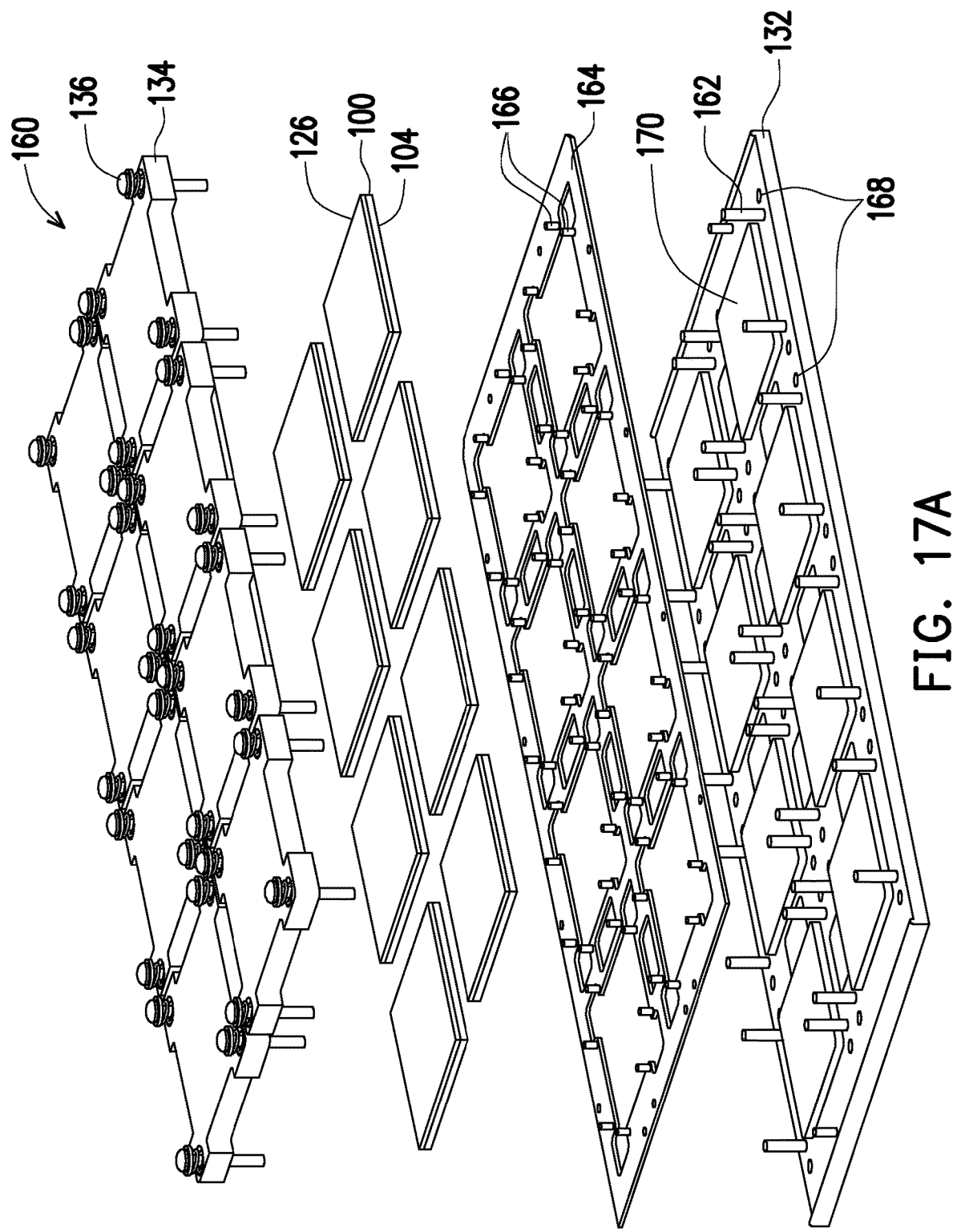
FIGS. 17A and 17B illustrate perspective views of a jig used to clamp a 3DIC, in accordance with some embodiments.
Figure 17B:
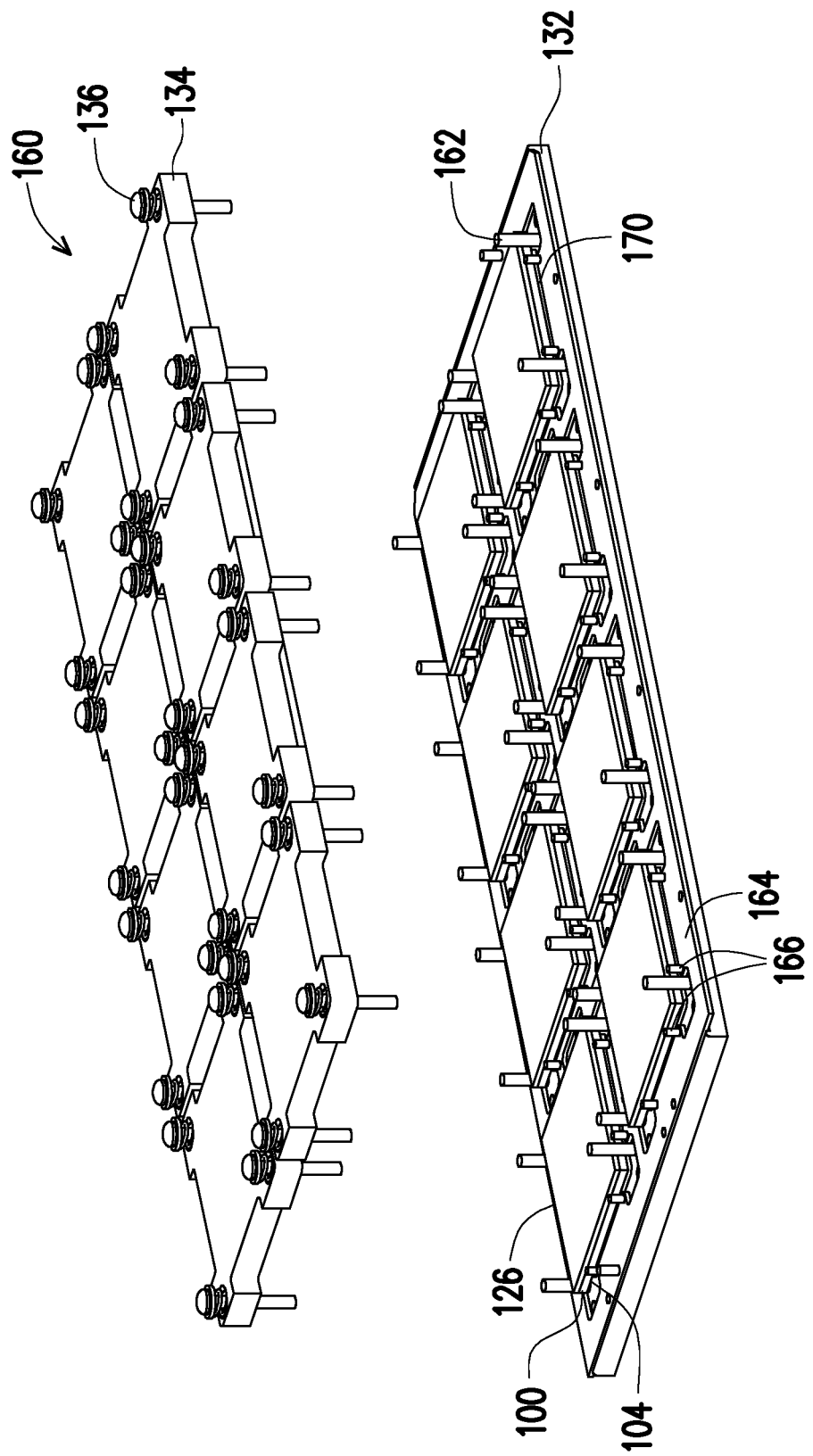

FIGS. 17A and 17B illustrate exploded perspective views of a jig 160 in accordance with an embodiment. The jig 160 may be used to clamp a plurality of CoWoS packages 100 during the clamped curing process. As illustrated in FIGS. 17A and 17B, the jig 160 includes a lower plate 132, a lower boat tray 164, and upper plates 134. Although the upper plates 134 are illustrated as being a separate plate for each CoWoS package 100, each of the upper plates 134 may be configured to clamp multiple CoWoS packages 100. The upper plates 134 include fasteners 136. The fasteners 136 may be screw-type fasteners, push-pin fasteners, magnetic fasteners, spring-lock fasteners, or any other type of fasteners suitable for fastening the upper plates 134 to the lower plate 132 during the clamped curing process. The fasteners 136 may be disposed on the upper plates 134 or the lower plate 132. The fasteners 136 may be fastened automatically, such as by robotic screw feed automation, using a pressing plate, or the like.

The lower plate includes clamp guide pins 162, fastener receiving holes 168, and package platforms 170. The clamp guide pins 162 may be used to align the upper plates 134 and the lower boat tray 164 with the lower plate 132. The fastener receiving holes 168 may be used to receive the fasteners 136 and may be threaded, may be magnetic, or may include other features to secure the fasteners 136. The CoWoS packages 100 may be placed on the package platforms 170 during the clamped curing process. The lower plate 132 may be formed of a heat conductive material such as aluminum, stainless steel, copper, nickel-plated copper, copper tungsten, aluminum silicon carbide, or the like. As illustrated in FIG. 17A, the various package platforms 170 may be disposed on a single lower plate 132. Any number of package platforms 170 may be disposed on the lower plate 132 arranged in any number of rows and columns, such as 2 rows by 4 columns.

The lower boat tray 164 may be used to align the CoWoS packages 100 with the lower plate 132. For example, as illustrated in FIGS. 17A and 17B, the lower boat tray 164 may include package guide pins 166, which may be used to align the CoWoS packages 100 with the package platforms 170. The lower boat tray 164 may have a thickness from about 1 mm to about 2 mm, such as about 1.2 mm. In some embodiments, the lower boat tray 164 may serve as a spacer between the lower plate 132 and the upper plates 134. In some embodiments, the features of the lower boat tray 164 may be integrated into the lower plate 132 such that the lower boat tray 164 and the lower plate 132 comprise a single integrated material.

One or more distribution plates (not separately illustrated) may be disposed on the package platforms 170 or between the upper plates 134 and the CoWoS packages 100. The distribution plates may be formed of an elastic material, a rubber material, or the like and may be used to evenly distribute the force applied during the clamped curing process across surfaces of the CoWoS packages 100.

FIG. 17B illustrates a partially-assembled perspective view of the jig 160 in accordance with an embodiment. As illustrated in FIG. 17B, the lower boat tray 164 may be aligned with the lower plate 132 using the clamp guide pins 162 and the package platforms 170. The package guide pins 166 are used to align the CoWoS packages 100 with the package platforms 170. Using the jig 160 to clamp the CoWoS packages 100 allows for multiple CoWoS packages 100 to be clamped and subjected to the clamped curing process simultaneously, which increases the throughput of the finished CoWoS packages 100. Additionally, CoWoS packages 100 cured using the jig 160 may be subjected to the clamped curing discussed above with respect to FIG. 4 and have reduced thicknesses, improved thermal performance, improved reliability, and reduced defects.

In accordance with an embodiment, a method includes bonding a device die to a first surface of a substrate; depositing an adhesive on the first surface of the substrate; depositing a thermal interface material on a surface of the device die opposite the substrate; placing a lid over the device die and the substrate, the lid contacting the adhesive and the thermal interface material; applying a clamping force to the lid and the substrate; and while applying the clamping force, curing the adhesive and the thermal interface material. In an embodiment, the adhesive is deposited before the thermal interface material is deposited. In an embodiment, the adhesive and the thermal interface material are cured for a period from 20 seconds to 2 hours. In an embodiment, the adhesive and the thermal interface material are cured at a temperature from 100° C. to 150° C. In an embodiment, the clamping force is from 3 kgf to 100 kgf. In an embodiment, applying the clamping force includes placing the lid, the device die, and the substrate between an upper plate and a lower plate; and fastening a plurality of fasteners between the upper plate and the lower plate. In an embodiment, fastening the plurality of fasteners includes torqueing a plurality of screw-type fasteners. In an embodiment, the method further includes depositing the adhesive on the surface of the device die opposite the substrate.

In accordance with another embodiment, a semiconductor device includes a substrate; a device die bonded to a first surface of the substrate, the device die being surrounded by an encapsulant; a first adhesive disposed on the first surface of the substrate on opposite sides of the device die, the first adhesive being separated from the device die; a second adhesive disposed on a surface of the device die opposite the substrate, the second adhesive contacting the encapsulant; a thermal interface material disposed on the surface of the device die opposite the substrate, the thermal interface material contacting the device die; a lid bonded to the substrate through the first adhesive and bonded to the device die through the thermal interface material and the second adhesive; and a sealing ring disposed on opposite sides of the first adhesive and extending from the lid to the substrate. In an embodiment, the first adhesive contacts a bottom surface of the lid and an inner sidewall of the lid perpendicular to the bottom surface. In an embodiment, the semiconductor device further includes spacers disposed in the first adhesive and the thermal interface material, the spacers separating the lid from the substrate and the device die. In an embodiment, the lid further includes relief features configured to allow the lid to deform, the relief features being disposed over the encapsulant, the second adhesive extending into the relief features. In an embodiment, the device die includes a high-power consuming die, the semiconductor device further including a low-power consuming die adjacent the high-power consuming die, the lid having a first thickness over the high-power consuming die and a second thickness over the low-power consuming die, and the first thickness being greater than the second thickness. In an embodiment, the device die includes a high-power consuming die, the semiconductor device further includes a low-power consuming die adjacent the high-power consuming die, the thermal interface material is disposed between the high-power consuming die and the lid, and the second adhesive is disposed between the low-power consuming die and the lid.

In accordance with yet another embodiment, an apparatus includes a lower plate, the lower plate including a plurality of package platforms, the package platforms being configured to hold a plurality of semiconductor packages; and a plurality of guide pins; a boat tray disposed on the lower plate, the boat tray being aligned with the plurality of package platforms and the plurality of guide pins, the boat tray including a plurality of package guide pins configured to align the semiconductor packages with the plurality of package platforms; a plurality of upper plates, each of the upper plates being aligned with each of the package platforms using the guide pins; and a plurality of fasteners applying a clamping force between the lower plate and the upper plates. In an embodiment, the plurality of fasteners includes screw-type fasteners. In an embodiment, the plurality of fasteners includes push pin-type fasteners. In an embodiment, the apparatus further includes a plurality of distribution plates disposed between the package platforms and the upper plates, the distribution plates configured to evenly distribute the clamping force on surfaces of the semiconductor packages. In an embodiment, the distribution plates include an elastic or rubber material. In an embodiment, the upper plates and the lower plate include aluminum, stainless steel, copper, nickel-plated copper, copper tungsten, or aluminum silicon carbide.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

forming an encapsulant surrounding a device die;

bonding the device die to an interposer substrate;

bonding the interposer substrate to a first surface of a substrate;

forming an underfill material between the device die and the interposer substrate, the underfill material surrounding sidewalls of the interposer substrate;

depositing an adhesive on the first surface of the substrate and a surface of the encapsulant opposite the substrate;

depositing a thermal interface material on a surface of the device die opposite the substrate;

placing a lid over the device die and the substrate, the lid contacting the adhesive and the thermal interface material, wherein the adhesive has a thickness between the lid and the encapsulant greater than a thickness of the thermal interface material between the lid and the device die;

applying a clamping force to the lid and the substrate; and
while applying the clamping force, curing the adhesive and the thermal interface material.

2. The method of claim 1, wherein the adhesive is deposited before the thermal interface material is deposited.

3. The method of claim 1, wherein the adhesive and the thermal interface material are cured for a period from 20 seconds to 2 hours.

4. The method of claim 1, wherein the adhesive and the thermal interface material are cured at a temperature from 100° C. to 150° C.

5. The method of claim 1, wherein the clamping force is from 3 kgf to 100 kgf.

6. The method of claim 1, wherein applying the clamping force comprises:
placing the lid, the device die, and the substrate between an upper plate and a lower plate; and
fastening a plurality of fasteners between the upper plate and the lower plate.

7. The method of claim 6, wherein fastening the plurality of fasteners comprises torqueing a plurality of screw-type fasteners.

8. The method of claim 1, further comprising depositing the adhesive on the surface of the device die opposite the substrate.

9. A method comprising:
bonding a device die to a first surface of a substrate;
bonding a low-power consuming die to the first surface of the substrate adjacent the device die;
forming an encapsulant surrounding the device die and the low-power consuming die, wherein the encapsulant extends continuously from a sidewall of the device die to a sidewall of the low-power consuming die;
depositing a first adhesive on the first surface of the substrate on opposite sides of the device die, the first adhesive being separated from the device die;
depositing a second adhesive on a first surface of the device die opposite the substrate, the second adhesive contacting the encapsulant;
depositing a thermal interface material on the first surface of the device die, the thermal interface material contacting the device die; and
bonding a lid to the substrate and the device die, wherein the lid is bonded to the substrate through the first adhesive, and wherein the lid is bonded to the device die through the thermal interface material and the second adhesive, and wherein distances between the lid and each of the substrate and the device die are controlled by spacers between the lid and each of the substrate and the device die.

10. The method of claim 9, wherein after bonding the lid to the substrate and the device die, the first adhesive contacts a bottom surface of the lid and an inner sidewall of the lid perpendicular to the bottom surface.

11. The method of claim 9, further comprising attaching the spacers to the first surface of the device die and the first surface of the substrate, the spacers being disposed in the first adhesive and the thermal interface material, the spacers separating the lid from the substrate and the device die.

12. The method of claim 9, wherein bonding the lid to the substrate causes the second adhesive to extend into relief features disposed in the lid.

13. The method of claim 9, wherein the device die comprises a high-power consuming die, wherein the lid has a first thickness over the high-power consuming die and a second thickness over the low-power consuming die, and wherein the first thickness is greater than the second thickness.

14. The method of claim 9, wherein the device die comprises a high-power consuming die, wherein the thermal interface material is disposed between the high-power consuming die and the lid, and wherein the second adhesive is disposed between the low-power consuming die and the lid.

15. A method comprising:
forming an encapsulant surrounding and extending between a first device die and a second device die;
bonding the first device die, the second device die, and the encapsulant to a first surface of a substrate;
depositing a first adhesive on the first surface of the substrate;
depositing a thermal interface material on a surface of the first device die opposite the substrate;
depositing a second adhesive on a surface of the second device die opposite the substrate, wherein the first device die comprises a high-power consuming die, and wherein the second device die comprises a low-power consuming die;
placing a lid over the first device die, the second device die, and the substrate, the lid contacting the first adhesive, the second adhesive, and the thermal interface material;
placing the substrate on a package platform of a lower plate;
placing an upper plate over the lid; and
applying a clamping force between the upper plate and the lower plate while curing the first adhesive and the thermal interface material.

16. The method of claim 15, wherein the clamping force is applied by a plurality of fasteners which extend through the upper plate and into the lower plate.

17. The method of claim 16, wherein the plurality of fasteners comprises a plurality of screws, wherein applying the clamping force comprises screwing the plurality of screws into the lower plate.

18. The method of claim 16, wherein the plurality of fasteners comprises a plurality of push-pin fasteners, wherein applying the clamping force comprises pushing the plurality of push-pin fasteners into the lower plate such that push-pin heads of the plurality of push-pin fasteners engage with the lower plate.

19. The method of claim 15, further comprising placing a distribution plate over the lower plate between the substrate and the lower plate or over the lid between the lid and the upper plate, wherein the distribution plate evenly distributes the clamping force on surfaces of the substrate and the lid.

20. The method of claim 15, further comprising placing a boat tray over the lower plate, wherein placing the substrate on the package platform comprises aligning the substrate with a plurality of package guide pins of the boat tray.

* * * * *